United States Patent [19]
Matsumura et al.

[11] Patent Number: 5,991,232
[45] Date of Patent: Nov. 23, 1999

[54] CLOCK SYNCHRONOUS MEMORY EMBEDDED SEMICONDUCTOR INTEGRATED CIRCUIT DEVICE

[75] Inventors: Masashi Matsumura; Akira Yamazaki; Isamu Hayashi; Atsuo Mangyo, all of Hyogo, Japan

[73] Assignees: Mitsubishi Denki Kabushiki Kaisha; Mitsubishi Electric Engineering Company Limited, both of Tokyo, Japan

[21] Appl. No.: 09/143,253

[22] Filed: Aug. 28, 1998

[30] Foreign Application Priority Data

Feb. 3, 1998 [JP] Japan .................................. 10-022303

[51] Int. Cl.[6] ...................................... G11C 8/00
[52] U.S. Cl. ............................. 365/233; 365/201
[58] Field of Search ..................... 365/201, 233, 365/189.02, 189.05, 230.02; 714/718

[56] References Cited

U.S. PATENT DOCUMENTS

| | | | |
|---|---|---|---|
| 5,294,750 | 3/1994 | Sakai et al. .............................. | 174/52.4 |
| 5,712,584 | 1/1998 | McClure .................................. | 327/198 |
| 5,757,705 | 5/1998 | Manning .................................. | 365/201 |
| 5,910,181 | 6/1999 | Hatakenaka et al. .................... | 714/718 |

FOREIGN PATENT DOCUMENTS 0 766 301 A1  4/1997  European Pat. Off. .

*Primary Examiner*—Son Mai
*Attorney, Agent, or Firm*—McDermott, Will & Emery

[57] ABSTRACT

A semiconductor integrated circuit device includes an SDRAM module operating in synchronization with a clock signal, a logic circuit transmitting data with the SDRAM module for effecting necessary processing, a direct memory access circuit taking in and transferring an externally applied signal in synchronization with the clock signal corresponding to an operation clock of the SDRAM module, and a selector selecting either the output signal of the logic circuit and the output signal of the direct memory access circuit in accordance with a test mode instructing signal for application to the SDRAM module. A test of a synchronous memory can be performed by externally making fast and direct access to the synchronous memory without an influence of a skew in a signal.

18 Claims, 18 Drawing Sheets

CLOCK SYNCHRONOUS MEMORY EMBEDDED SEMICONDUCTOR INTEGRATED CIRCUIT DEVICE

BACKGROUND OF THE INVENTION

1. Field of the Invention

The present invention relates to a semiconductor integrated circuit device containing a large capacity memory such as a DRAM (Dynamic Random Access Memory) and a logic circuit such as a processor, which are integrated on a common semiconductor substrate, and in particular relates to a semiconductor integrated circuit device containing a synchronous memory operating in synchronization with a clock signal and a logic circuit in an integrated form. More particularly, the invention relates to a structure for externally testing the synchronous memory.

2. Description of the Background Art

Recently, a DRAM-embedded logic semiconductor integrated circuit device, in which a logic circuit such as a processor (which will be referred to merely as a "logic circuit" hereinafter) and a DRAM having a large storage capacity are integrated on a common chip (semiconductor substrate), has been developed. In this DRAM-embedded logic semiconductor integrated circuit device, it is possible to reduce a length of an interconnection line between the logic circuit and the DRAM, and a parasitic capacitance and a resistance of the interconnection line can be made small so that signals and data can be transmitted fast. Since the logic circuit and the DRAM are mutually connected only through internal interconnection lines, there is not restriction on the number of pin terminals. Therefore, a data bus width can be made wider to increase a bit width of data to be transferred, and therefore fast data transfer is allowed.

In the DRAM-embedded logic semiconductor integrated circuit device, only the logic circuit is coupled to the pin terminals through pads. Therefore, if functions of the embedded DRAM are to be tested, the test must be conducted through the logic circuit. In this case, however, the logic circuit performs the control for the test, and therefore a burden on the logic circuit increases. Also, the test must be performed in such a manner that an instruction for a function test of the DRAM is externally applied to the logic circuit, the logic circuit applies a control signal for the function test to the DRAM, and the result of the test is read out through the logic circuit. Thus, the function test of the DRAM is conducted through the logic circuit, and accurate tests of an operation timing margin of the DRAM and others cannot be performed. Also, the number of test patterns generated by the logic circuit is restricted due to a program capacity or the like so that the test cannot be conducted sufficiently, and it is impossible to determine the reliability of the DRAM with high accuracy. Accordingly, it becomes necessary to test externally and directly the DRAM through a dedicated test device.

FIG. 24 schematically shows a whole structure of a DRAM-embedded logic semiconductor integrated circuit. In FIG. 24, a DRAM-embedded logic semiconductor integrated circuit device (which will be referred to merely as a "semiconductor integrated circuit device" hereinafter) 900 includes a DRAM module 902, a logic circuit 904 which accesses data of DRAM module (macro) 902 and performs predetermined processing in accordance with an externally applied instruction or an embedded program, and a select circuit which selects either I/O nodes of logic circuit 904 or testing pads TPa, - - - , TPb, TPc, - - - and TPd for electrically connection to DRAM module 902 in accordance with a test mode instructing signal TE applied through a test pad 907. Logic circuit 904 is externally supplied with data or a signal through pads LPa, LPb, LPc, - - - , LPd, LPe, - - - and LPf. Generally, the semiconductor integrated circuit device 900 is provided with pads arranged along the periphery of the chip. FIG. 24 shows only some of the pads.

Select circuit 906 electrically connects testing pads TPa-TPb and TPc-TPd to DRAM module 902 when test mode instructing signal TE applied through pad 907 is active. DRAM module 902 includes a plurality of memory cells, a memory cell select circuit and a control circuit for the memory cell select circuit. In the structure shown in FIG. 24, DRAM module 902 can be externally and directly accessed by activating test mode instructing signal TE, for testing DRAM module 902 in accordance with a test program which has been conventionally used.

FIG. 25 shows a specific structure of the semiconductor integrated circuit device shown in FIG. 24. In FIG. 25, DRAM module 902 includes a data input node WD receiving write data of a 256-bit width, a control signal input node CD receiving a control signal, an address signal input node AD receiving an address signal of a 16-bit width, and a data output node RD supplying data of a 256-bit width.

For the test, there are provided a write data input pad WPD receiving write data of a 8-bit width, a control signal input pad CPD receiving a control signal, an address input pad APD receiving an address signal of 16 bits, a read data pad RPD receiving read data of an 8-bit width, and a data select address input pad SPD receiving an address signal for selecting data of 8 bits from the data of a 256-bit width read from DRAM module 902.

For write pad WPD, there is provided a distributing circuit 908 which extends the externally applied write data of 8 bits to test data of 256 bits. For read data pad RPD, there is provided a select circuit 909 for selecting data of 8 bits from data of 256 bits in accordance with an address signal for data selection applied from data select address pad SPD.

Select circuit 906 includes a switching circuit 906w selecting either the write data of 256 bits from logic circuit 904 or the write data of 256 bits from distributing circuit 908, a switching circuit 906c selecting the control signal from logic circuit 904 and the control signal from control signal input pad CPD, a switching circuit 906a for selecting one of the address signal of 16 bits from logic circuit 904 and the address signal of 16 bits from address input pad APD, and a switching circuit 906r for transmitting the data of 256 bits read from DRAM module 902 to one of logic circuit 904 and select circuit 909.

Connection paths of these switching circuits 906w, 906c, 906a and 906r are determined by test mode instructing signal TE. An operation of the semiconductor integrated circuit device shown in FIG. 25 will be described below with reference to FIG. 26.

Select circuit 906 connects pads CPD, APD and RPD to DRAM module 902 in accordance with activation of test mode instructing signal TE. Upon writing of data, an address signal A0 is applied to address input pad APD, and a write instructing signal (WRITE) instructing data writing is applied to control signal input pad CD. Write data WD0 is applied to write data input pad WPD. Distribution circuit 908 extends the write data to a data of 256 bits. The address signal, control signal and write data reach DRAM module 902 with a delay due to delays at internal interconnection in es extending from the pads, distribution circuit 908 and select circuit 906. Therefore, skews occur in the signals arriving at input nodes AD, CD and WD of DRAM module 902. When the signals arrive to DRAM module 902 and the signals on input node WD, CD and AD of DRAM module 902 are made definite, data writing is performed in DRAM module 902.

When data reading is to be performed, address signal A1 is applied to address input pad APD, as is done in the data writing, and a data read instructing signal (READ) is applied to control signal input pad CPD. Skews likewise occur on input nodes AD and CD of DRAM module 902 when address signal and control signal arrive at DRAM module 902 and are made definite. When the read instruction is applied, selection of the memory cell is performed in DRAM module 902 in accordance with address signal A1, and data RD1<0:255> of 256 bits appears on read data output node RD. When this read data appears, an address RDSA1 for data selection is applied to data select address input pad SPD. Due to an interconnection line delay between pad SPD and select circuit 909, a skew occurs in the data select address applied to node SD of select circuit 909 until it is defined. When data select address RDSA1 is definite on node SD of select circuit 909, data RD1<0:7> of 8 bits in 256 bits is selected and applied to read data output pad RPD. When the data reading is performed subsequently, read data from DRM module 902 changes so that a skew occurs on read data output node RD of DRAM module 902, and a skew likewise occurs on read data output pad RPD.

FIG. 26 shows that write data WD1 and WD2 are applied to write data input pads WPD even in the data read operation, only for clearly showing that a skew likewise occurs in the write data on write data input node WD of DRAM module 902. In the data read operation, it is not necessary to apply the write data to write data input pad WPD. Even if write data is applied, DRAM module 902 ignores the data applied to write data input node WD in data reading mode (by disabling the write data input buffer and write driver).

As shown in FIG. 26, the signals applied to the pads reach the corresponding nodes of DRAM module 902 through paths having different electrical characteristics, so that the definition timings shift due to interconnection line delays and the changed in bit numbers when the signals change, and skews occur.

DRAM module 902 takes in the address signal in accordance with the applied control signal, and allows the data access. An operation cycle for the test performed by externally and directly accessing DRAM module 902, which in turn takes in the address signal merely in synchronization with the control signal, is determined by a period from change in address signal applied to address input pad APD to the next change. DRAM module 902 selects a memory cell in accordance with the address signal which keeps a definite state for a period shorter than this operation cycle. Since the operation cycle of such DRAM module 902 is relatively long, the above skew occupies a short period in the operation cycle, and the influence exerted by this skew on the operation of the DRAM module can be substantially ignored.

Recently, such synchronous memories have been used that perform input/output of data and take in externally applied signals in synchronization with a clock signal different from the control signal. For example, input/output of data synchronized with a clock signal such as a system clock makes a data transfer speed equal to the speed of the clock signal. Since externally applied signals are taken in based on the clock signal, it is not necessary to give consideration to the shift (skew) in timing between external signals so that the internal circuits can start the operation at a faster timing, which allows fast access. A synchronous DRAM (SDRAM) is one of such kinds of synchronous memories. If this SDRAM is used in place of the DRAM module shown in FIG. 24 for data transfer between the logic circuit and the memory, the SDRAM module can operate in accordance with the clock signal so that it is possible to implement a DRAM-embedded logic semiconductor integrated circuit device capable of faster operation. In this case, a function test must be externally performed on the embedded SDRAM module (macro) for ensuring the reliability. For this, DRAM module 902 in the structure shown in FIG. 25 may be replaced with the SDRAM module.

FIG. 27 schematically shows a structure of a main portion of the SDRAM-module embedded logic semiconductor integrated circuit device. In FIG. 27, select circuit 906 which selects a signal transmission path in accordance with test mode instructing signal TE is arranged between an SDRAM module 910 and a logic circuit 912. Since SDRAM module 910 operates in synchronization with the clock signal, the clock signal is applied from logic circuit 912. During a test, SDRAM module 910 is externally supplied with a clock signal through a pad CKPD. Select circuit 906 includes a switching circuit 906ck for selecting one of the clock signal from logic circuit 912 and the clock signal from pad CKPD. Structures other than the above are the same as those shown in FIG. 25, and corresponding portions bear the same reference numerals.

SDRAM module 910 takes in signals applied to nodes WD, CD and AD in synchronization with clock signal CLK applied to its clock input node CKD, and outputs data from read data output node RD in synchronization with the clock signal. The operation of the semiconductor integrated circuit device shown in FIG. 27 will be described below with reference to a timing chart of FIG. 28.

In a test mode operation, test mode instructing signal TE is activated, and select circuit 906 isolates SDRAM module 910 from logic circuit 912 and sets SDRAM module 910 to a state allowing external access thereto through a pad. The clock signal applied to clock input pad CKPD is applied to clock input node CKD of SDRAM module 910 through select circuit 906. The clock signal applied to pad CKPD is merely applied to clock input node CKD of SDRAM module 910 with a delay.

The address signal is applied to address input pad APD in every clock cycle of the clock signal which in turn is externally applied to pad CKPD. The address signal applied to input pad APD has a plurality of bits, and a transition timing of each bit is different from the others so that a skew is present in the address signal reaching address input node AD of SDRAM module 910.

The control signal applied to control signal input pad CPD is applied to control signal input node CD of SDRAM module 910, and a skew likewise occurs when the state of the control signal changes. Since both the write operation instructing signal and read operation instructing signal change, consideration must be given on both the worst and best cases of the change (transition) timings of both the signals. Likewise, the write data applied to write data input pad WPD is 8-bit data, and is extended to 256 bits by distribution circuit 908, and is applied to SDRAM module 910 through select circuit 906, resulting in a skew. A skew likewise occurs in the address signal.

Address input pad APD is supplied with an address signal which is in the definite state at the rising of clock signal applied to clock input pad CKPD. SDRAM module 910 takes in the applied signal at the rising edge of clock signal applied to clock input node CKD. Therefore, it takes in address signal A1 applied in cycle #0 of the clock signal, which in turn is applied to clock input pad CKPD, in accordance with the data read instructing signal (READ) applied to control signal node CD, and the data reading is performed.

In SDRAM module 910, a memory cell is internally selected in accordance with this address signal A1. SDRAM module 910 has a structure similar to that of a conventional SDRAM, and a period which is called a column read latency (CAS latency) CL is required until the data is actually output after the data read instruction is applied. FIG. 28 shows the data read operation in the case where column read latency CL is 1. Therefore, data RD1<0:255> of the memory cell designated by this address signal A1 is made definite in cycle #1 of the clock signal applied to clock input pad CKPD. Data output node RD of SDRAM module 910 is coupled to select circuit 909 through select circuit 906r, and a skew occurs in the read data due to a load capacitance of this path. In cycle #1 of the clock signal applied to clock input pad CKPD, an address for data selection is applied to pad SPD, and select circuit 909 selects and outputs 8-bit data RD1<0:7> in accordance with a data select address RDSA1 applied to node SD.

In cycle #1 of the clock signal applied to clock input pad CKPD, the data read instruction is applied again, and next data is read in accordance with applied address signal A2. In cycle #2 of the clock signal applied to clock input pad CKPD, next data is likewise read in accordance with applied address signal A3. For the next read instruction, a data select address RDSA2 is applied, and next read data RD2<0:7> is read out. In this case, the selecting operation in select circuit 90 causes a skew in the read data applied to pad PRD.

FIG. 28 shows a state that write data WD1, WD2, WD3 and WD4 are also successively applied to write data input pad WPD in the data read operation. This is for clearly showing that a skew occurs in the write data transmitted to SDRAM module 910 when the write data changes. Even if the write data is applied during the data reading, SDRAM module 910 performs data reading in accordance with the read instruction, and does not perform the data writing so that no malfunction occurs. This is also true in such a case that an address RDSA for selecting the read data is applied during the data writing.

As shown in FIG. 28, the operation cycle of SDRAM module 910 is determined by the cycle of the clock signal applied to control signal input pad CKPD. This clock signal is a fast clock signal. Therefore, a proportion of the skew to the clock cycle in SDRAM module 910 is larger than that in asynchronous DRAM shown in FIGS. 24 and 25 even if the time widths of skews are equal to each other. SDRAM module 910 takes in externally applied data in synchronization with the rising edge of the clock signal applied to clock input node CKD, or outputs the data in synchronization with the same clock signal. If the skew is large, therefore, signals cannot be taken in accurately, and instructed operations cannot be performed accurately. If the skew is large, a period for which the signal applied to each input node of SDRAM module 910 is valid decreases. Therefore, an external test device must be operated under consideration of this skew caused when the operation mode instructing signal changes, and the clock cycle period effectively decreases, resulting in such a problem that fast external test of the SDRAM module is impossible.

In the SDRAM module shown in FIG. 28, the burst length (the number of data which is successively written/read per one data I/O node when data write/read instruction is applied) is one. However, even if the burst length is more than one, select circuit 909 shown in FIG. 27 performs the selecting operation during data reading. Therefore, a skew occurs in the read data, because the read data at node SPD changes at every clock cycle.

Column read latency CL can be changed in accordance with the clock cycle period of SDRAM module 910 because the time required for data reading is constant independently of the clock cycle.

FIG. 29 shows a data read operation with column read latency CL of 3. With column read latency CL of 3, SDRAM module 910 takes in the data read mode instruction together with the address signal in accordance with the clock signal applied to clock input node CLKD, and data RD1<0:255> of the addressed memory cell will be made definite after elapsing of 3 clock cycles. In cycle #3 of the clock signal applied to clock input node CKD of SDRAM module 910, the data is output.

When column read latency CL is changed, it is therefore necessary to apply externally the address signal for data selection to pad SPD in accordance with this changed column read latency, and it is necessary to change the timing of applying the address signal for data selection in accordance with the value of column read latency CL, resulting in disadvantageous increase in load on an external test device.

Therefore, a fast test cannot be performed if an SDRAM module operating in synchronization with a fast clock signal, is employed together with a structure for externally testing a clock-asynchronous DRAM module, which in turn takes in the address signal merely in accordance with signals /RAS and /CAS.

SUMMARY OF THE INVENTION

An object of the invention is to provide a synchronous memory embedded logic semiconductor integrated circuit which allows accurate and fast execution of an external test of a synchronous memory such as an SDRAM module.

Briefly stating, according to the present invention, a synchronous direct memory access circuit operating in synchronization with a clock signal is arranged between a selector and a pad.

A semiconductor integrated circuit device according to the invention includes a synchronous memory operating in synchronization with a clock signal; a logic circuit formed on a semiconductor substrate with the synchronous memory for performing transmission of data to and from the synchronous memory; a synchronous direct memory access circuit for taking in signals including data and applied externally to the semiconductor substrate in synchronization with a test clock signal corresponding to the clock signal; and a select circuit for selecting either the output signal of the logic circuit or the output signal of the synchronous direct memory access circuit in response to a test mode instructing signal and applying the selected output signal to the synchronous memory.

Since the synchronous direct memory access circuit takes in the externally applied signal in synchronization with the clock signal, the output signal thereof is made definite in synchronization with the clock signal, and a signal of which skew is extremely reduced is transmitted to the synchronous memory because of the same change timings. Owing to taking of the signals synchronized with the clock signal, a valid period of the signal applied to the synchronous memory can be made sufficiently long, and an influence exerted by the skew can be minimized, which allows fast operations as well as accurate operations of the synchronous memory.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment 1]

Figure 1:
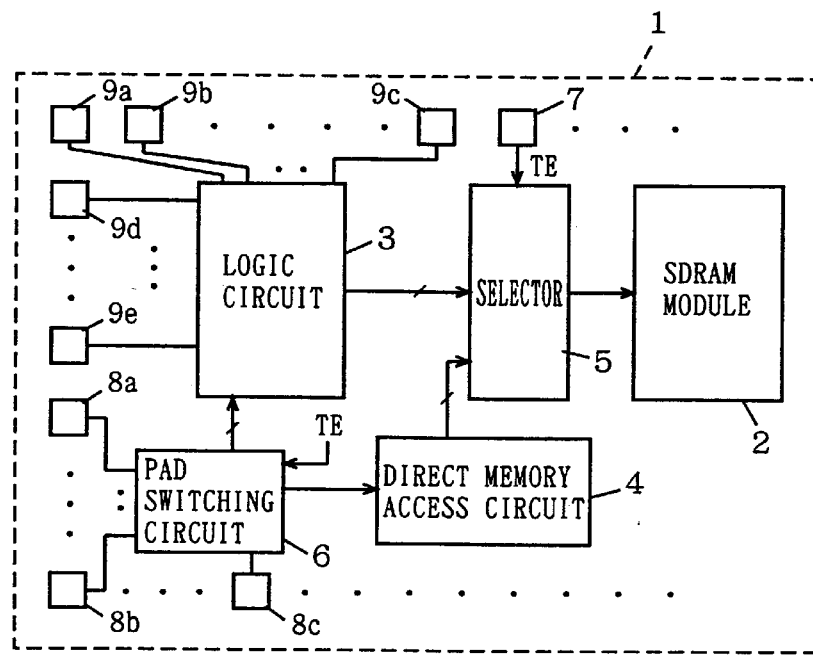
FIG. 1 schematically shows a whole structure of a semiconductor integrated circuit device according to an embodiment 1 of the invention.

FIG. 1 schematically shows a whole structure of a semiconductor integrated circuit device according to an embodiment 1 of the invention. In FIG. 1, a semiconductor integrated circuit device 1 includes an SDRAM module 2 which has dynamic memory cells for storing data and operates in synchronization with a clock signal, a logic circuit 3 which transmits the data to and from SDRAM module 2, a (synchronous) direct memory access circuit 4 which takes in and transmits externally applied signals (including data) in synchronization with the clock signal, a selector 5 which selects the output signal of one of logic circuit 3 and direct memory access circuit 4 in accordance with test mode instructing signal TE and applies the selected one to SDRAM module 2, and a pad switching circuit 6 which electrically connect pads 8a–8b–8c to one of logic circuit 3 and direct memory access circuit 4 in accordance with test mode instructing signal TE applied from an external test device (not shown) through a pad 7.

Logic circuit 3 also performs input/output of signals through other pads 9a, 9b–9c, 9d–9e. When test mode instructing signal TE is active, pad switching circuit 6 electrically connects pads 8a–8c–8c to direct memory access circuit 4. When test mode instructing signal TE is inactive, pad switching circuit 6 electrically connects these pads 8a–8b–8c to logic circuit 3. The pads for test are commonly used as the pads for the normal operation mode, whereby an area occupied by the pads is reduced. Although many pads are arranged along the four sides of semiconductor integrated circuit device 1, all of them are not clearly shown in FIG. 1 for simplicity purpose, and are represented merely by a mark of "•".

Pads 8a–8b–8c are supplied with test data, control signals required for the test operation and a clock signal for synchronously operating SDRAM module 2. Direct memory access circuit 4 takes in and transfers the signals (which include data unless specified otherwise hereinafter) applied through pad switching circuit 6 in synchronization with the externally applied clock signal.

Figure 2:
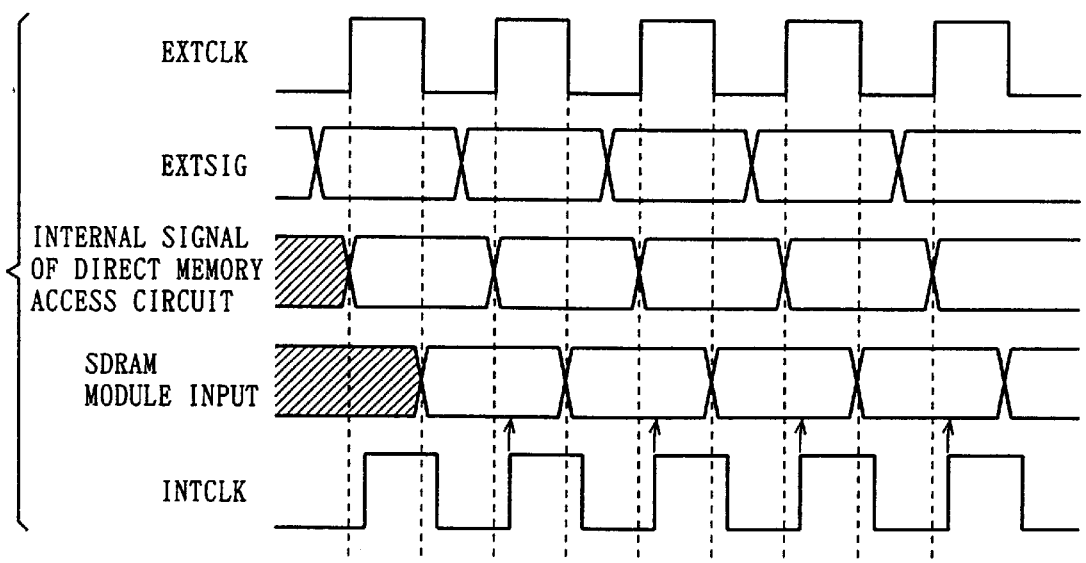
FIG. 2 is a timing chart representing an operation of the semiconductor integrated circuit device shown in FIG. 1.

FIG. 2 is a timing chart representing an operation of semiconductor integrated circuit device 1 shown in FIG. 1. In FIG. 2, an external clock signal EXTCLK is an external clock signal applied to clock input pad included in pads 8a–8c, and an external signal EXTSIG is a representative example of the address signals, data and control signals applied to pads 8a–8c. External signals EXTSIG applied to pads 8a–8c are applied from an external test device (not shown) in synchronization with clock signal EXTCLK. Direct memory access circuit 4 takes in external signal EXTSIG, which is applied through pad switching circuit 6, in synchronization with external clock signal EXTCLK in the test operation.

Within semiconductor integrated circuit device 1, a skew occurs in the signals due to a variation in signal transmission delay period which is caused by a difference in interconnection line capacitance between signal paths from pads to the SDRAM module, a difference in interconnection line length, a difference in interconnection line resistance and/or a difference in timing of change between signals at intermediate circuits.

Since direct memory access circuit 4 takes in external signal EXTSIG in synchronization with external clock signal EXTCLK, no or only a slight skew occurs in the signal within direct memory access circuit 4 because it takes in the definite external signal. In FIG. 2 the state is shown that no skew occurs in the signal applied from the test device to the pad.

Direct memory access circuit 4 applies its internal signal to SDRAM module 2 through selector 5 in synchronization with external clock signal EXTCLK. In this case, the signal from direct memory access circuit 4 is transmitted in synchronization with clock signal EXTCLK, and is made definite at the timing which depends on external clock signal EXTCLK so that no or only a slight skew occurs. SDRAM module 2 receives external clock signal EXTCLK through direct memory access circuit 4 or selector 5. Therefore, internal clock signal INTCLK applied to the clock input node of SDRAM module 2 is a clock signal which is merely delayed with respect to external clock signal EXTCLK.

In synchronization with the rising of internal clock signal INTCLK, SDRAM module 2 takes in the signal applied thereto. In this state, direct memory access circuit 4 generates the signal in synchronization with the clock signal, and the signal transmitted to the inputs of SDRAM module 2 is in the stable state when internal clock signal INTCLK rises. Therefore, SDRAM module 2 can reliably takes in the applied signal and can reliably perform the internal operation.

The internal signal of semiconductor integrated circuit device 1 is taken in and transferred in synchronization with external clock signal EXTCLK corresponding to operation clock signal INTCLK of SDRAM module 2, whereby the timing of change of the internal signal is determined based on the timing of change of external clock signal EXTCLK, and the internal signal can be transmitted to SDRAM module 2 while substantially suppressing the skew so that it is possible to access externally and directly SDRAM module 2 and operate SDRAM module 2 without any influence by the skew. Thereby, SDRAM module 2 can be reliably tested in a fast operation environment.

Figure 3:
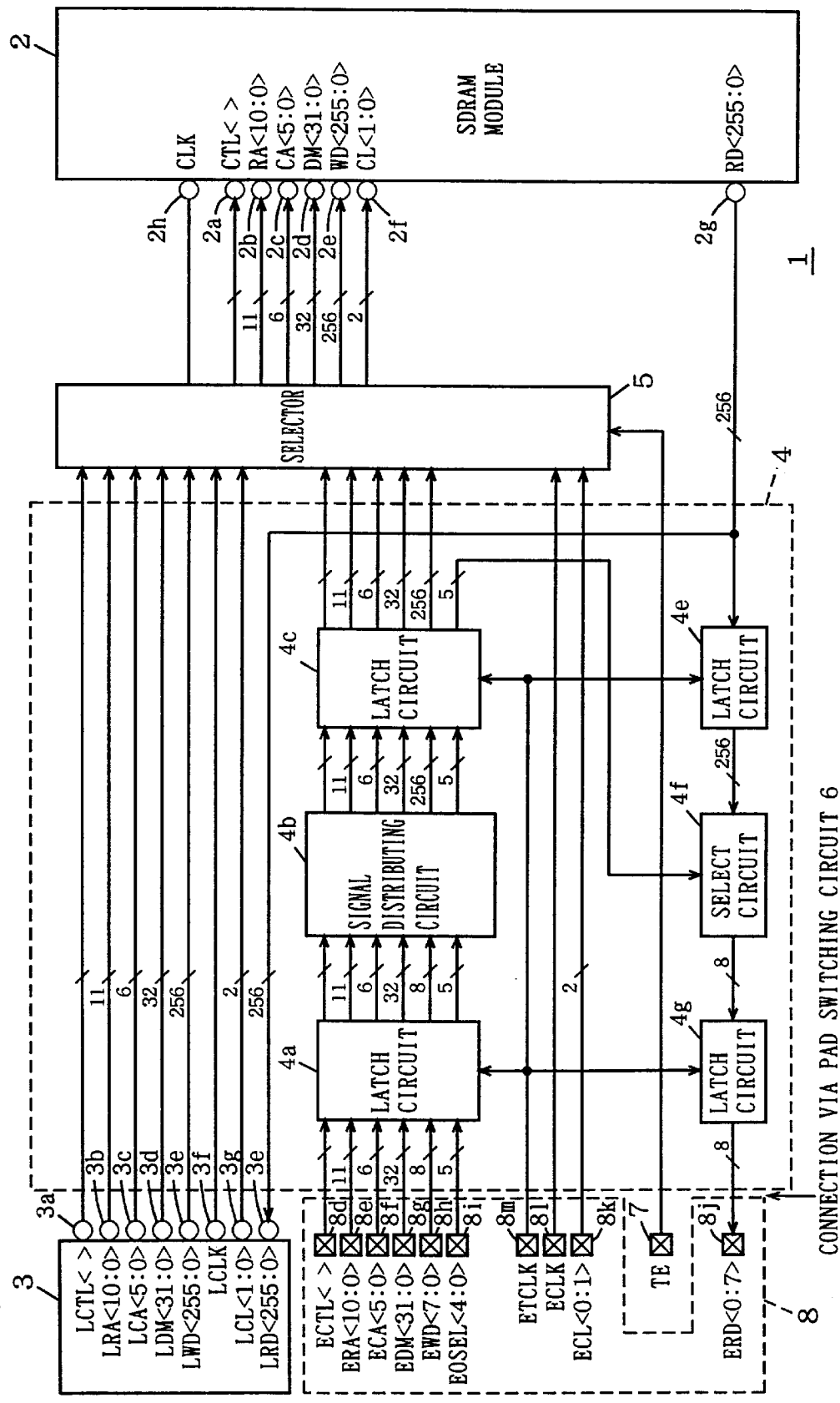
FIG. 3 specifically shows a structure of a semiconductor integrated circuit device according to the embodiment 1 of the invention.

FIG. 3 shows a more specific structure of the semiconductor integrated circuit device shown in FIG. 1. In FIG. 3, SDRAM module 2 includes a control signal input node group 2a receiving a control signal CTL< >, a row address signal input node group 2b receiving a row address signal RA<10:0> of 11 bits, a column address signal input node group 2c receiving a column address signal CA<5:0> of 6 bits, a write mask input node group 2d receiving a write data mask signal DM<31:0> specifying the bit in the write data to be masked, a data input node group 2e receiving write data WD<255:0> of 256 bits, an input node group 2f receiving latency data CL<1:0> indicating column read latency CL, and a data output node group 2g outputting read data of 256 bits. SDRAM module 2 performs input/output of data and takes in the applied signal in synchronization with clock signal CLK applied to a clock signal input node 2h.

Latch circuits for latching the applied address signals are provided for row address signal input node group 2b and column address signal input node group 2c, respectively. In SDRAM module 2, all the input nodes thereof are connected by internal interconnection lines, and it is not necessary to reduce the number of pins. In this SDRAM module 2, therefore, row address signal input node group 2b and column address signal input node group 2c are arranged independently from each other. The latch circuits, which are provided for row and column address signal input groups 2b and 2c, respectively, are operated in accordance with the operation mode instructing signal included in control signal CTL< >.

Logic circuit 3 likewise includes node groups corresponding to the input node groups of SDRAM module 2, respectively, and more specifically includes an output node group 3a for a control signal LCTL< >, an output node group 3b for a row address signal LRA<10:0>, an output node group 3c for a column address signal LCA<5:0>, an output node group 3d for write mask data LDM<31:0>, an output node group 3e for write data LWD<255:0>, an output node 3f for a clock signal LCLK, an output node group 3g for column read latency data LCL<1:0> and input node group 3e for data LRD<255:0>.

External pad group 8 corresponding to pads 8a–8c shown in FIG. 1 includes an input node group 8d for a control signal ECTL< >, an input pad group 8e for a row address signal ERA<10:0>, an input pad group 8f for a column address signal ECA<5:0>, an input pad group 8g for write data mask instruction data EDM<31:0>, an input pad group 8h for write data EWD<7:0> of 8 bits, an input pad group 8i for an output select address EOSEL<4:0> used for selecting read data of 8 bits from read data RD<255:0> of 256 bits which in turn is read from SDRAM module 2, and a data output pad group 8j for generating read data ERD<0:7>.

External pad group 8 further includes a pad group 8k for externally applied column read latency data ECL<0:1>, an input pad 8l for external clock signal ECLK applied to SDRAM module 2, and a pad 8m receiving a test clock signal ETCLK which controls a signal transfer operation in direct memory access circuit 4.

Two clock signals ECLK and ETCLK are used, and signal transfer in direct memory access circuit 4 is performed with test signal ETCLK, whereby it is possible to move, with respect to clock signal CLK applied to the clock input node CLK of SDRAM module 2, the window of a setup time and a hold time of the signal applied to SDRAM module 2 for clock signal CLK, and a test of an operation margin can be performed.

External pad group 8 corresponds to pads 8a–8b–8c shown in FIG. 1, and pad switching circuit 6 shown in FIG. 1 is arranged between direct memory access circuit 4 and external pad group 8. In FIG. 3, however, pad switching circuit 6 for selectively connecting the pad group to logic circuit 3 and direct memory access circuit 4 is not shown for simplicity purpose.

Direct memory access circuit 4 includes a latch circuit 4a for latching (taking in) the signal, which is applied through pads 8d–8i, in synchronization with, e.g., the rising of test clock signal ETCLK applied through pad 8m, a signal distributing circuit 4b which extends the write data in the data latched by latch circuit 4a to the write data of 256 bits, and transmits the remaining signals as are, a latch circuit 4c which latches the output signal of signal distributing circuit 4b in synchronization with, e.g., the falling of test clock signal ETCLK from pad 8m, and a selector 5 responsive to test mode instructing signal TE applied through pad 7 for selecting the output signal of latch circuit 4c, clock signal ECLK from pad 8l, column read latency data ECL<0:1> from pad 8a and the output signal of logic circuit 3.

Each of latch circuits 4a and 4c holds the applied signal for a period equal to one clock cycle of test clock signal ETCLK. Latch circuits 4a and 4c latch the signals which are applied in synchronization with different edges (the rising and falling edges, or falling and rising edges) of test clock signal ETCLK, respectively. Therefore, the signals applied to pads 8d–8i are applied to SDRAM module 2 through selector 5 after elapsing of one clock cycle of external clock signal ETCLK.

The direct memory access circuit 4 further includes a latch circuit 4e latching data RD<255:0> of 256 bits, which is read from SDRAM module 2, in synchronization with test clock signal ETCLK, a select circuit 4f selecting data of 8 bits from 256-bit data latched by latch circuit 4e in accordance with a data select address signal OSEL<4:0> applied from latch circuit 4c, and a latch circuit 4g which latches and applies the read data received from select circuit 4f to pad group 8j in synchronization with test clock signal ETCLK.

Latch circuit 4e latches the applied data, for example, at the falling edge of test clock signal ETCLK. Latch circuit 4g supplies the data received from select circuit 4f, for example, at the rising edge of test transfer clock signal ETCLK. Data output node group 2g of SDRAM 2 is connected to data input node group 3e of logic circuit 3. During the data reading in the test operation, logic circuit 3 is inactive, and no problem occurs even if SDRAM module 2 applies the test data thereto. By transmitting read data RD<255:0> to logic circuit 3 with selector 5 bypassed, the read data can be transferred rapidly from SDRAM module 2 to logic circuit 3 without causing a skew in the normal operation mode (because a gate delay in selector 5 does not occur). In this case, output node group 2g of SDRAM module 2 is not connected to any pad and selector 5, and is connected only to the internal interconnection lines so that a large parasitic capacitance is not present, and the read data can be transferred fast to latch circuit 4e and logic circuit 3 with a very small skew. Now, an operation of the semiconductor integrated circuit device shown in FIG. 3 in a test mode will be described below.

The operation in data writing mode is the same as that shown in the timing chart of FIG. 2. Internal clock signal INTCLK is applied to clock input node 2h of SDRAM module 2, and the signal applied through selector 5 is taken in at the rising edge of clock signal CLK. The latch circuits 4a and 4c are in the latching state at the rising and falling edges of test clock signal ETCLK, respectively. The output nodes of latch circuits 4a and 4c are isolated from the pads. The change timings of output signals of latch circuits 4a and 4c are determined by the test clock signal TCLK, and the signal is applied to SDRAM module 2 through selector 5 with nearly no skew. An operation in data reading will be described below with reference to FIG. 4.

In cycle #1 of external clock signal ECLK, external control signal ECTL (ECTL< >) is set to the state (read) specifying the data reading. This external control signal ECTL is latched by latch circuit 4a in synchronization with the rising of test clock signal ETCLK. Then, the data latched by latch circuit 4a is transmitted through signal distributing circuit 4b and latch circuit 4c, and is applied to SDRAM module 2 through selector 5 in synchronization with the falling edge of external clock signal ECLK in clock cycle #1. SDRAM module 2 is also supplied with external clock signal ECLK through direct memory access circuit 4.

SDRAM module 2 takes in control signal CTL< > applied to control signal input node group 2a in synchronization with the rising of clock signal CLK in clock cycle #2 of external clock signal ECLK, and internally starts the data read operation. Since column read latency CL is 1, SDRAM module 2 outputs read data RD<255:0> at the next rising edge of internal clock signal CLK (in clock cycle #3 of external clock signal ECLK). Thereafter, the read instruction is applied in every clock cycle, and data is successively read out from SDRAM module 2.

Latch circuit 4e latches the data read from SDRAM module 2 at the falling edge of test clock signal ETCLK. In cycle #3 of external clock signal ECLK, address EOSEL (EOSEL<4:0>) for data selection is externally applied, and the output signal of latch circuit 4c changes in synchronization with the falling of external clock signal ECLK in clock cycle #3. Therefore, the output data of latch circuit 4e and the address signal for data selection from latch circuit 4c are made definite at the same timing, and select circuit 4f selects the data of 8 bits from read data RD<255:0> of 256 bits latched by latch circuit 4e in accordance with received address signal OSEL<4:0> for data selection. Latch circuit 4g takes in and latches the output signal of select circuit 4f in synchronization with the rising edge of test clock signal ETCLK. Therefore, read data ERD<7:0> of data output pad group 8j changes in synchronization with the falling edge of test clock signal ETCLK in cycle #4 of external clock signal ECLK (see the waveform (i) in FIG. 4). Thereafter, data is transmitted to data output node group 8j in synchronization with the rising edge of test clock signal ETCLK.

Figure 4:
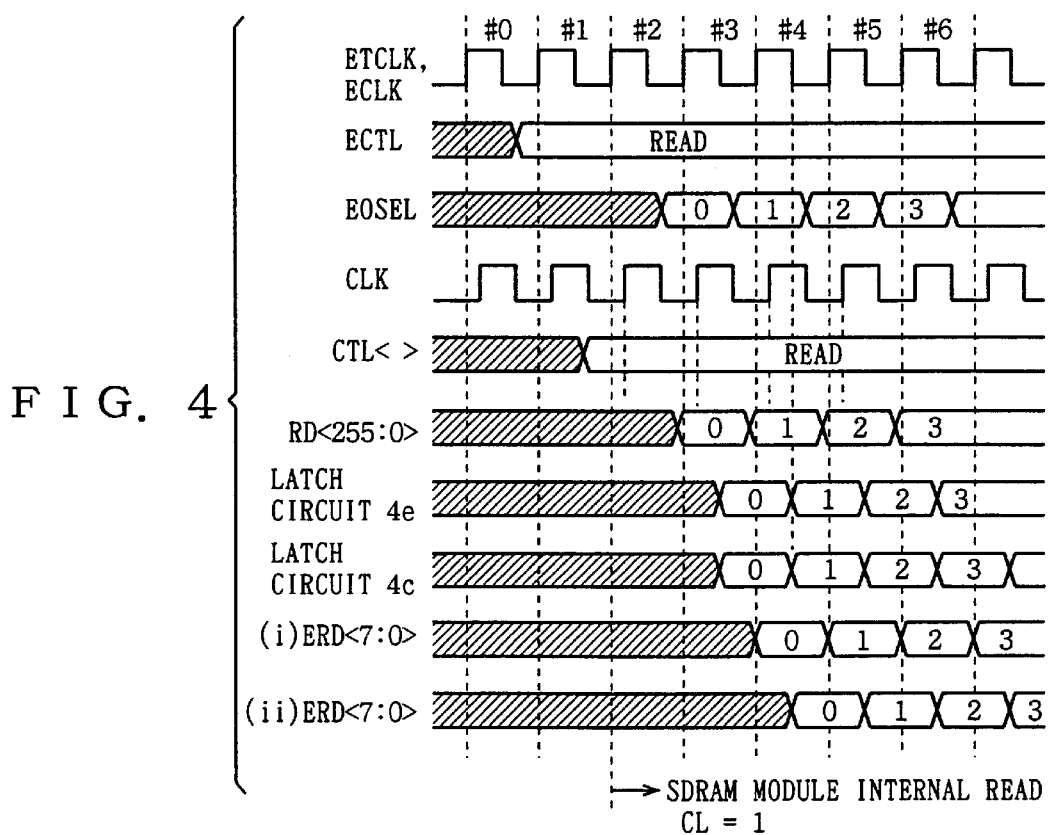
FIG. 4 is a timing chart representing an operation of the semiconductor integrated circuit device shown in FIG. 3.

According to the waveform (i) in FIG. 4, latch circuit 4g latches and outputs the data applied thereto in synchronization with the rising edge of test clock signal ETCLK. However, latch circuit 4g may have such a structure that it takes in the data applied from select circuit 4f in synchronization with the rising edge of test clock signal ETCLK, and then outputs the same in synchronization with the falling edge of test clock signal ETCLK (see (ii) in FIG. 4). This operation can be achieved merely by employing latch circuit 4g formed of two flip-flops, as will be described later.

In the data read operation, therefore, the data read from SDRM module 2 is latched in synchronization with test clock signal ETCLK, and then is output in synchronization with the same so that the definite signal is transmitted, and therefore the signal (data) is latched and transferred at the timing of being at the definite state. Therefore, read data having a sufficiently long valid period can be transmitted to pad group 8j with nearly no skew, and fast data reading can be performed by externally and directly accessing SDRAM module 2. Structures of respective portions will be described below.

[Operation of Two Clock Signals]

Figure 5:
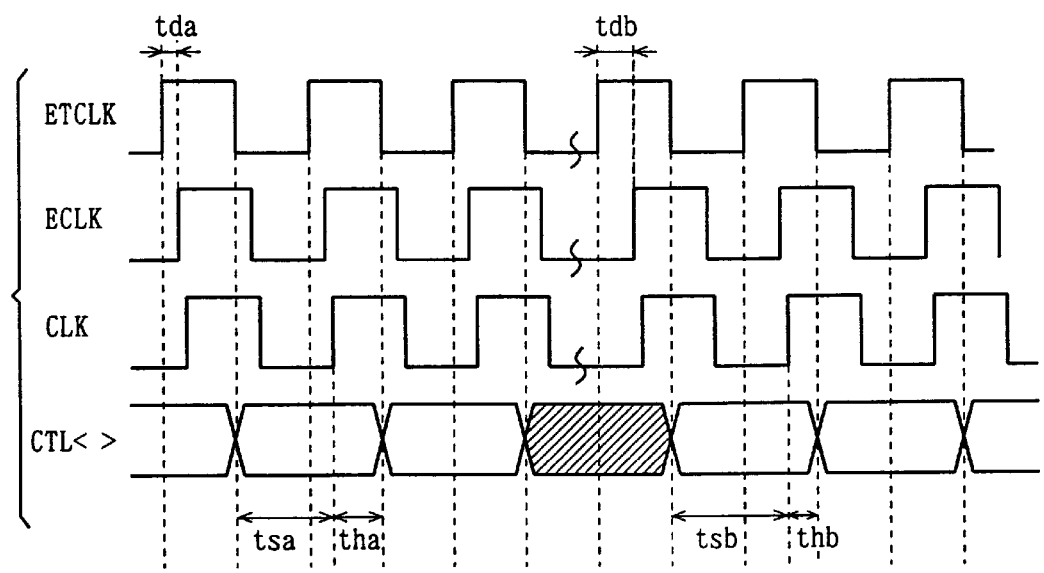
FIG. 5 is a timing chart for showing an operational effect of a test clock signal and a clock signal for operating a synchronous memory.

FIG. 5 shows a relationship in timing between test clock signal ETCLK and clock signal ECLK (CLK) applied to SDRAM module 2. It is now assumed that external clock signal ECLK has a delay time tda with respect to test clock signal ETCLK, as shown in FIG. 5. The SDRAM module receives signal CLK which is produced by delaying external clock signal ECLK. Direct memory access circuit 4 generates control signal CTL< > in synchronization with the falling of test clock signal ETCLK. The SDRAM module takes in the signal applied thereto in synchronization with the rising of clock signal CLK, and performs the internal operation. In this case, therefore, the setup time and hold time of control signal CTL< > are equal to tsa and tha, respectively.

When external clock signal ECLK has a delay time tdb with respect to test clock signal ETCLK (tdb>tda), SDRAM module 2 is supplied with control signal CTL< > in synchronization with the falling of external test clock signal ETCLK so that the timing of its definition does not change.

Clock signal CLK is produced by delaying external clock signal ECLK. In this case, therefore, the time of change of control signal CTL< > with respect to the rising edge of clock signal CLK moves, and the setup and hold times are equal to tsb and thb, respectively. In this case, hold time thb is shorter than hold time tha, and setup time tsb is longer than setup time tsa.

By supplying externally supplied clock signals ETCLK and ECLK therefore, margins for the setup time and the hold time for the SDRAM module can be tested.

[Structure of Latch Circuit]

Figure 6A:
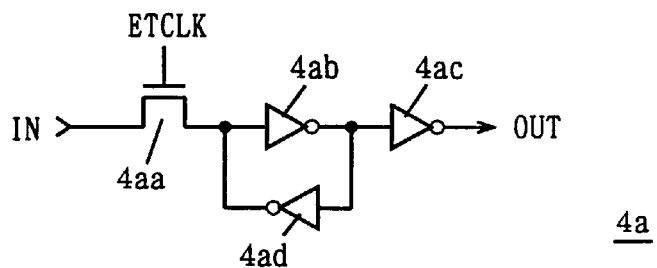
FIG. 6A shows a structure of a latch circuit performing latching in synchronization with the test clock signal.
Figure 6B:
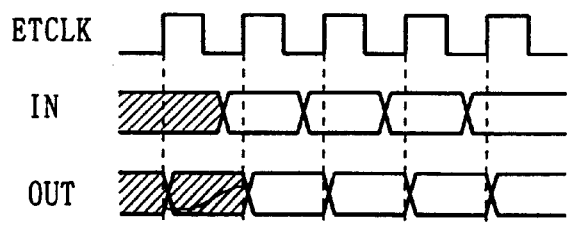
FIG. 6B is a timing chart representing an operation of the latch circuit shown in FIG. 6A.

FIG. 6A shows an example of a structure of latch circuit 4a shown in FIG. 3. In FIG. 6A, latch circuit 4a includes a transfer gate 4aa which is turned on when test clock signal ETCLK is at H-level, an inverter 4ab inverting a signal IN applied thereto through transfer gate 4aa, an inverter 4ac inverting the output signal of inverter 4ab to produce an output signal OUT, and an inverter 4ad inverting and transmitting the output signal of inverter 4ab to the input of inverter 4ab. Inverters 4ab and 4ad form a latch circuit. An operation of latch circuit 4a shown in FIG. 6A will be described below with reference to a waveform diagram of FIG. 6B.

When test clock signal ETCLK is at H-level, transfer gate 4aa is turned on to take in and transmit input signal IN to inverter 4ab. Input signal IN applied through transfer gate 7aa is latched by inverters 4ab and 4ad. Inverter 4ac inverts the output signal of inverter 4ab to produce output signal OUT. When test clock signal ETCLK attains L-level, transfer gate 4aa is turned off, and latch circuit 4a attains the latching state so that output signal OUT does not change its state regardless of the state of the input signal IN. Therefore, output signal OUT changes in synchronization with the rising of test clock signal ETCLK, and maintains the same state for one clock cycle period.

Figure 7:
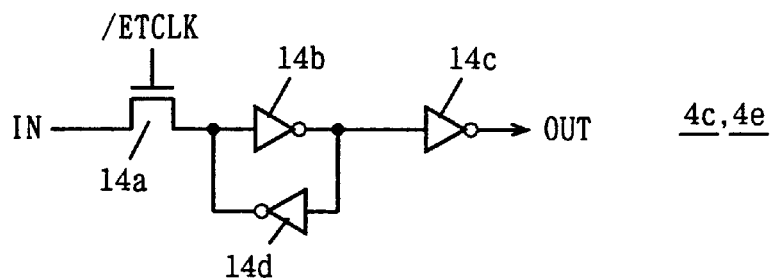
FIG. 7 shows an example of a structure of a latch circuit performing latching in synchronization with a complementary test clock signal.

FIG. 7 shows structures of latch circuits 4c and 4e shown in FIG. 3. In FIG. 7, each of latch circuits 4c and 4e includes a transfer gate 14a which is turned on when test clock signal /ETCLK is at H-level, an inverter 14b which inverts input signal IN applied through transfer gate 14a, an inverter 14c which inverts the output signal of inverter 14b to produce output signal OUT, and an inverter 14d which inverts the output signal of inverter 14b for transmission to the input of inverter 14b.

Latch circuits 4c and 4e shown in FIG. 7 have the same structures as latch circuit 4a shown in FIG. 6 except for the phase of the test clock signal applied thereto. Therefore, latch circuits 4c and 4e take in and latch input signal IN when test clock signal ETCLK is at L-level (when complementary test clock signal /ETCLK is at H-level), and they hold (latch) the states of their output signal OUT when test clock signal ETCLK is at L-level (when complementary test clock signal is at L-level). It is possible to provide the latch circuit which generates the signal in synchronization with the falling of test clock signal ETCLK.

If latch circuit 4a for data output shown in FIG. 3 has the same structure as latch circuit 4a shown in FIG. 6A, data can be output with the timing of external read data ERD<7:0> shown at (i) in FIG. 4.

[Structure of Data Output Latch Circuit 4e]

Figure 8:
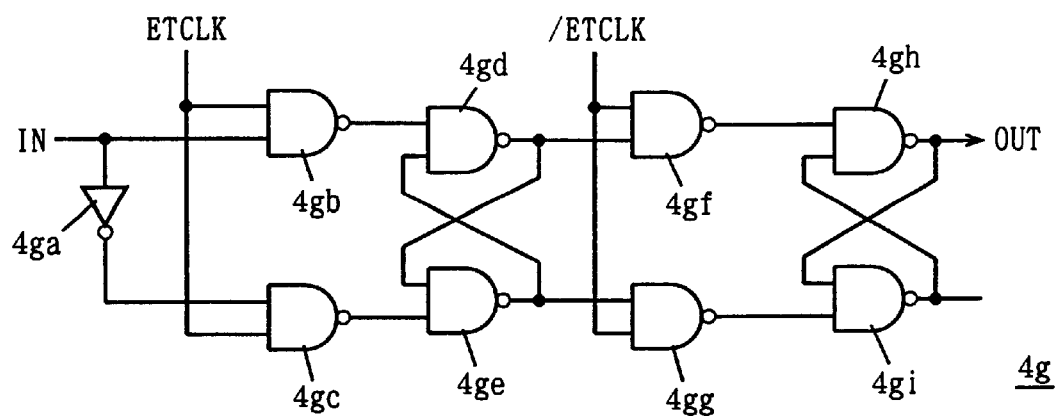
FIG. 8 shows another structure of the latch circuit.

FIG. 8 shows another structure of latch circuit 4e outputting the read data shown in FIG. 3. In FIG. 8, latch circuit 4g includes an inverter 4ga receiving input signal IN, an NAND circuit 4gb receiving input signal IN and test clock signal ETCLK, an NAND circuit 4gc receiving the output signal of inverter 4ga and test clock signal ETCLK, and NAND circuits 4gd and 4ge latching the output signals of NAND circuits 4gb and 4gc, respectively. NAND circuit 4gd receives the output signals of NAND circuits 4gb and 4ge. NAND circuit 4ge receives the output signals of NAND circuits 4gc and 4gd.

Figure 9:
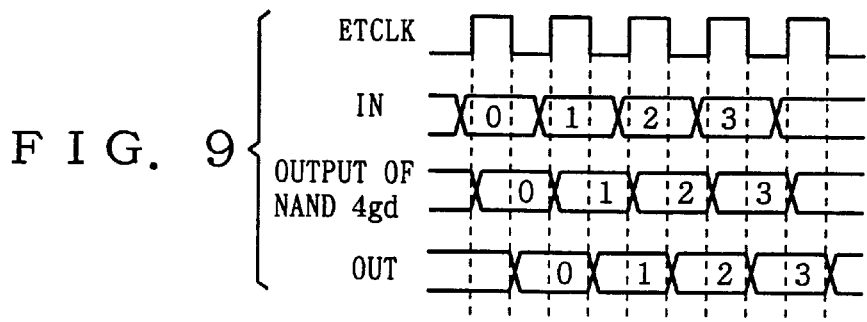
FIG. 9 is a timing chart representing an operation of the latch circuit shown in FIG. 8.

Latch circuit 4g further includes an NAND circuit 4gf receiving complementary test clock signal /ETCLK and the output signal of NAND circuit 4gd, an NAND circuit 4gg receiving complementary test clock signal /ETCLK and the output signal of NAND circuit 4ge, and NAND circuits 4gh and 4gi latching the output signals of NAND circuits 4gf and 4gg. NAND circuit 4gh receives the output signals of NAND circuits 4gh and 4gi, and generates output signal OUT. NAND circuit 4gi receives output signal OUT of NAND circuit 4gh and the output signal of NAND circuit 4gg. An operation of the latch circuit shown in FIG. 8 will be described below with reference to a timing chart of FIG. 9.

When test clock signal ETCLK is at H-level, complementary test clock signal /ETCLK is at L-level. In this state, NAND circuits 4gb and 4gc operate as inverters, and input signal IN and the output signal of inverter 4ga are transmitted to NAND circuits 4gd and 4ge through NAND circuits 4gb and 4gc and are latched therein. Therefore, the output signals of NAND circuits 4gd and 4ge change in synchronization with the rising of test clock signal ETCLK. Meanwhile, the output signals of NAND circuits 4gf and 4gg have been fixed to H-level so that the state of output signal OUT does not change.

When test clock signal ETCLK lowers to L-level, the output signals of NAND circuits 4gb and 4gc attain H-level, and the states of output signals of NAND circuits 4gd and 4ge do not change. Meanwhile, NAND circuits 4gf and 4gg operate as inverters, and transmit the output signals of NAND circuits 4gd and 4ge to NAND circuits 4gh and 4gi, respectively. Therefore, the state of output signal OUT changes in synchronization with the falling of test clock signal ETCLK. Thereafter, input signal IN is transmitted in synchronization with the rising or falling of test clock signal ETCLK.

By using the latch circuit shown in FIG. 8, taking of input signal IN can be performed in synchronization with the rising of test clock signal ETCLK, and output of output signal OUT can be performed in synchronization with the falling of test clock signal ETCLK. Thus, the applied read data can be output from the select circuit at the timing of read data ERD<7:0> shown at (ii) in FIG. 4.

Latch circuits 4a, 4c, 4e and 4g may be formed of a D-type flip-flop which takes in and latches a signal applied thereto in synchronization with the edge of clock signal.

[Structure of Memory Cell Array]

Figure 10A:
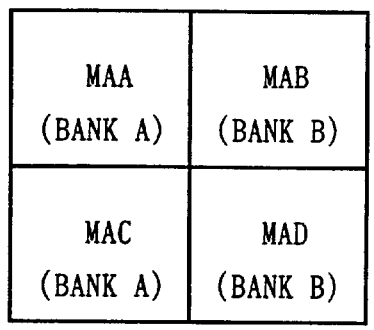
FIGS. 10A to 10D schematically show an array structure in the SDRAM module.

FIG. 10A schematically shows a structure of a memory cell array in SDRAM module 2. In FIG. 10A, the memory array includes four memory mats MAA, MAB, MAC and MAD. Memory mats MAA and MAC form a bank A, and memory mats MAB and MAD form a bank B. The banks are designated by a bank address signal which is applied simultaneously with each of row and column address signals but is not shown in this figure. Each of banks A and B can be activated and deactivated to perform/stop row selection independently of the other bank.

Figure 10B:
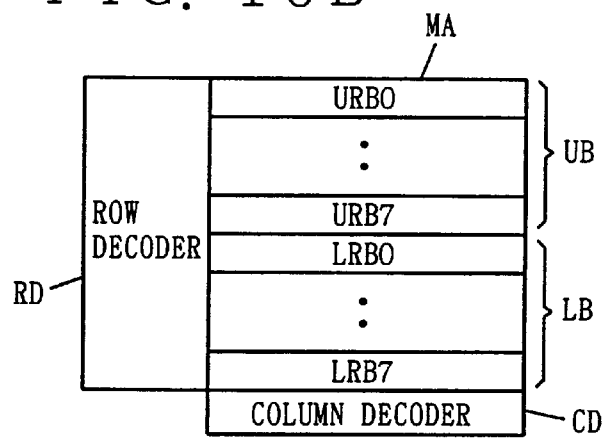

FIG. 10B schematically shows a structure of one memory mat MA. Memory mat MA (MAA–MAD) is divided into upper and lower blocks UB and LB. Each of these blocks UB and LB is divided into eight row blocks URB0–URB7 and LRB0–LRB7, respectively. A row decoder RD for selecting a row and a column decoder CD for selecting a column are provided for memory mat MA. Row decoder RD selects a word line in one of the row blocks of each of upper and lower blocks UB and LB.

Figure 10C:
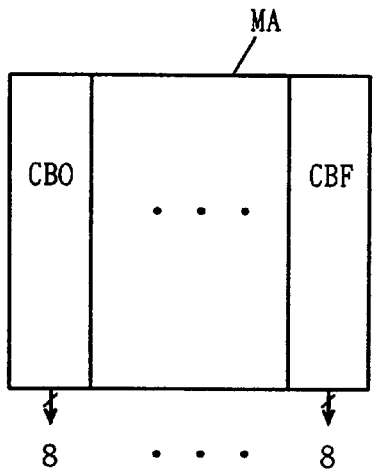

FIG. 10C schematically shows a structure relating to columns in one memory mat MA. Memory mat MA is divided into 16 column blocks CB0–CBF. Each of column blocks CB0–CBF extends through the upper and lower blocks UB and LB shown in FIG. 10B. Column decoder CD simultaneously selects four columns in each of column blocks CB0–CBF. Memory cells of 4 bits are selected in upper block UB, and memory cells of 4 bits are selected in lower block LB. Therefore, memory cells of 8 bits are simultaneously selected in each of column blocks CB0–CBF. In one memory mat MA, therefore, the memory cells of 8.16=128 bits are simultaneously selected.

Figure 10D:
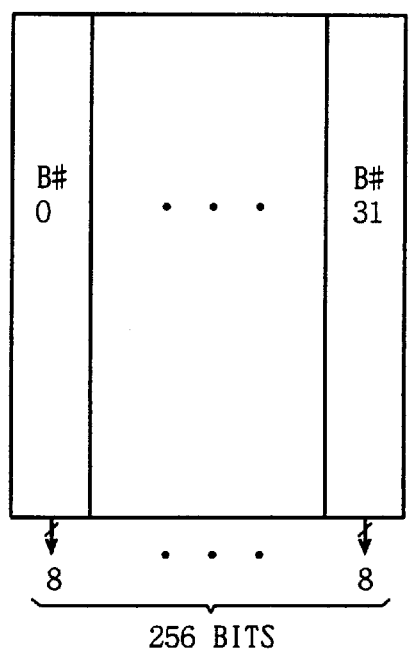

FIG. 10D shows a structure relating to column blocks in one bank. Since one memory mat is divided into 16 column blocks CB0–CBF, each bank consisting of two memory mats has equivalently the memory array divided into 32 column blocks B#0–B#31. Since the memory cells of 8 bits are simultaneously selected in each of column blocks B#0–B#31, the memory cells of 256 bits in total are simultaneously selected in one bank. A write drive circuit is provided for each of column blocks B#0–B#31. A write data mask instruction bit DM<31:0> masks the data writing for each column block, or on a column block basis.

Figure 11:
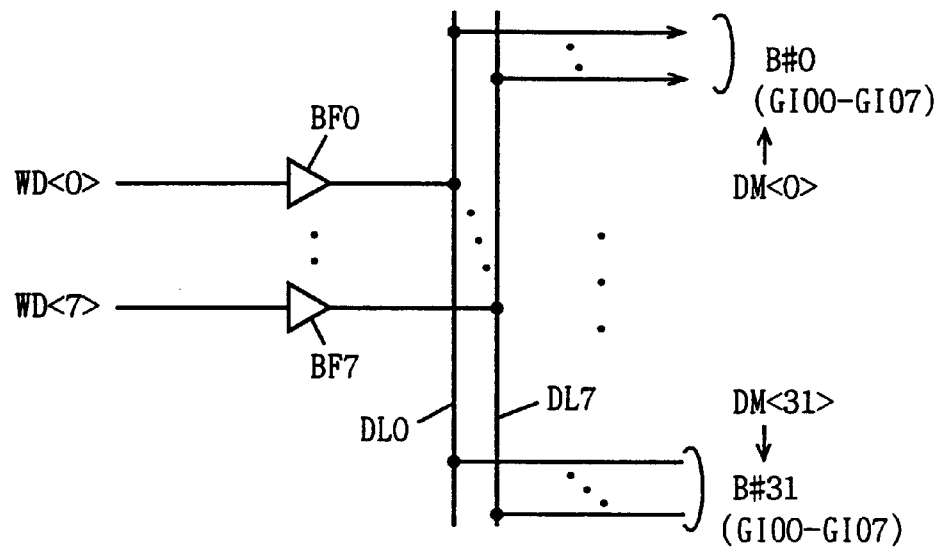
FIG. 11 schematically shows a structure of a portion of a signal distributing circuit producing 256-bit write data from 8-bit write data.

FIG. 11 shows a structure of a write data extending portion included in the direct memory access circuit. In FIG. 11, buffers BF0–BF7 are provided for write data bits WD<0>–WD<7>, respectively. The output signals of buffers BF0–BF7 are transmitted onto data transfer lines DL0–DL7, respectively. Data transfer line DLi is connected to corresponding data lines GIOi in column blocks B#0–B#31. Therefore, write data WD<0>–WD<7> of 8 bits are extended corresponding to global I/O bus line pairs (GIO0–GIO7) of column blocks B#0–B#31. Thereby, write data WD<0>–WD<7> of 8 bits is transmitted in each of column blocks B#0–B#31, and write data WD<255:0> of 256 bits in total is produced from write data WD<0>–WD<7> of 8 bits. The global I/O bus line pair is a data transmitting line which is provided in each column block and extends in the column direction. Mask instruction bits WD<0>–WD<7> are provided corresponding to column blocks B#0–B#31 for the data write masking.

[Structure of Select Circuit 4f]

Figure 12:
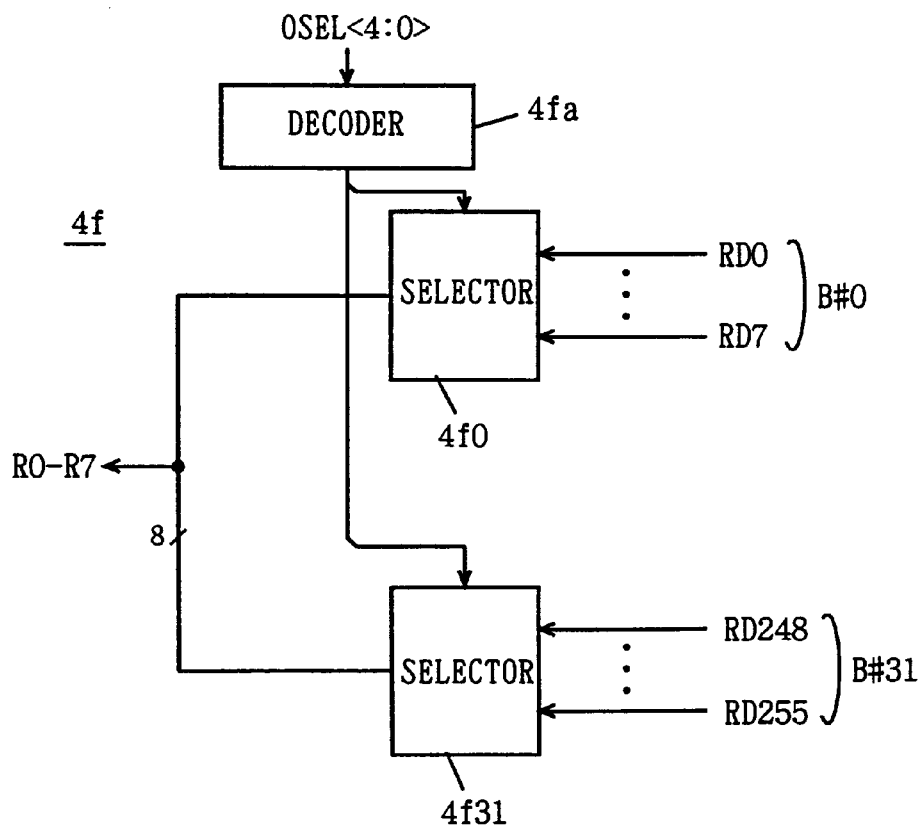
FIG. 12 schematically shows a structure of a select circuit shown in FIG. 3.

FIG. 12 schematically shows a structure of select circuit 4f shown in FIG. 3. In FIG. 12, select circuit 4f includes a decoder 4fa which decodes a data select address signal OSEL<4:0> applied from latch circuit 4c, and selectors 4f0–4f31 which are provided for read data of 256 bits from the SDRAM module. Selectors 4f0–4f31 are provided one for each set of the read data of 8 bits for selecting the corresponding 8-bit data in accordance with the signal applied from decoder 4fa.

In the example shown in FIG. 12, read data bits RD0–RD7 are read from column block B#0, and bits RD248–RD255 are read from column block B#31. Thus, selectors 4f0–4f31 are provided corresponding to column blocks B#0–B#31. Decoder 4fa decodes address signal OSEL<4:0> of 5 bits for data selection, and generates a signal designating one of 32 blocks B#0–B#31. Each of selectors 4f0–4f31 includes the select circuits of 8 bits, and attains the output high-impedance state when unselected. The output signals of selectors 4f0–4f31 are applied to latch circuit 4g shown in FIG. 3.

Each of selector 4f0–4f31 is formed of transfer gates (transmission gates) or tristate buffers of 8 bits. In the data write operation, data of 8 bits is supplied to each of blocks B#0–B#31. Select circuit 4f selects one of the blocks in accordance with data select address signal OSEL<4:0> for reading out the data of 8 bits. Matching/mismatching in logic between write data bit WD<7:0> and read data ERD<7:0> is determined in a test mode, and a failure can be detected for each column block.

In direct memory access circuit 4, the remaining address signals and control signals are processed merely such that they are internally buffered and transferred between the latch circuits.

According to the embodiment 1 of the invention, as described above, since the signals including data and externally applied through the pads are taken in and transferred in synchronization with the clock signal, the signals can be transferred at the timings after definition of the respective signals, and the period of definite state can be made sufficiently long. Also, the signals start to change in the same timing so that the test can be performed by externally and directly accessing the SDRAM module in synchronization with a fast clock signal without an influence by the skew.

According to the above structure, the test clock signal determining the timings of taking and transfer of the signals of the direct memory access circuit is applied through a path different from a path of the clock signal determining the operation timing of the SDRAM module. Therefore, it is possible to change externally the setup time and hold time of the signal for the SDRAM module, and the operation margin of the SDRAM can be tested.

These clock signals ETCLK and CLK may be signals which are applied through the same pad.

[Embodiment 2]

Figure 13:
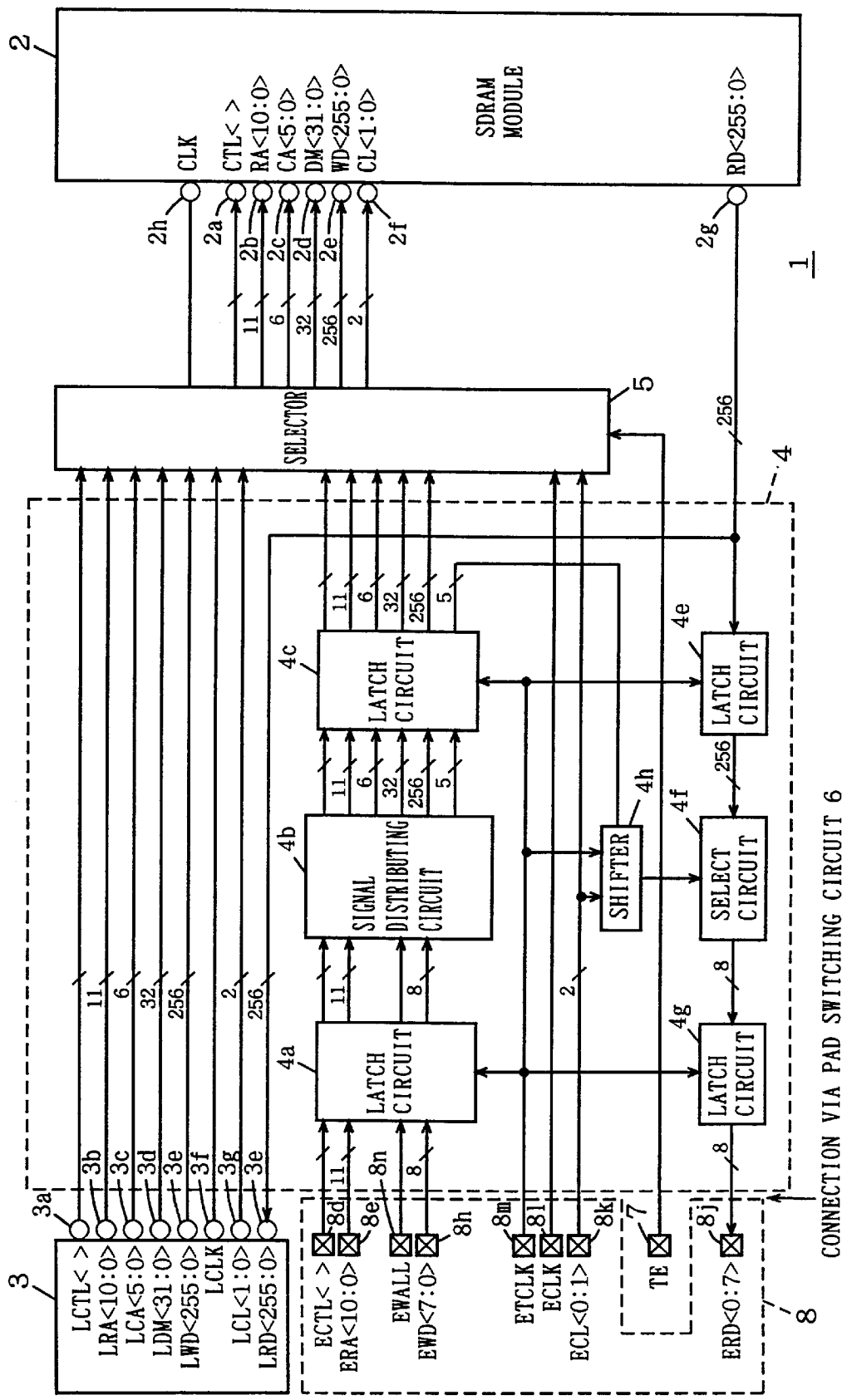
FIG. 13 schematically shows a whole structure of a semiconductor integrated circuit device according to an embodiment 2 of the invention.

FIG. 13 schematically shows a whole structure of a semiconductor integrated circuit device according to an embodiment 2 of the invention. In the semiconductor integrated circuit device shown in FIG. 13, direct memory access circuit 4 is supplied with the address signal through a pad group 8e. Preferably, pad group 8e is externally supplied with row address signal ERA<10:0>, column address signal ECA<5:0> and address signal EOSEL<4:0> in a time-division multiplexing manner. Write mask bit EDM<31:0> is not supplied thereto, and there is provided a pad 8n receiving a write instructing signal EWALL for reliably performing writing on all the bits.

For commonly using the input pad group for the row address, column address and data selection address, there is provided a shifter 4h shifting the address signal for data selection generated from latch circuit 4c in accordance with the value of column read latency CL of SDRAM module 2. Shifter 4h performs the shifting of a period equal to column read latency CL plus one clock cycle. For SDRAM module 2, the row selection instruction and the column selection instruction are applied in different clock cycles, respectively. This manner is the same as that in the standard SDRAM. Therefore, pad group 8e can be used commonly to the row and column address signals, whereby the pads can be reduced in number, and the output terminals of the test device can be reduced in number. By using shifter 4h, select circuit 4f can accurately select data among the data which in turn appears after elapsing of the column read latency and then is latched by latch circuit 4e even if the address signal for data selection is taken in when the data read instruction is applied.

Figure 14:
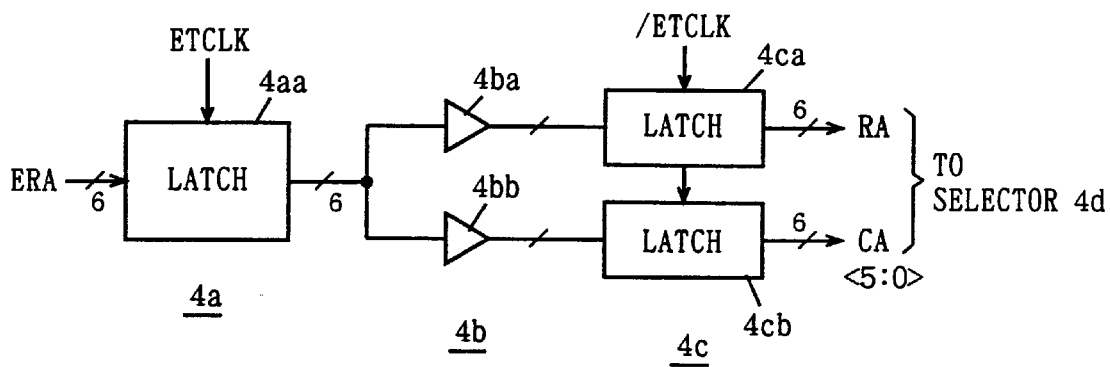
FIG. 14 schematically shows a structure of a signal distributing circuit shown in FIG. 13.

FIG. 14 shows a structure of a portion related to the row and column address signals of direct memory access circuit 4 shown in FIG. 13. Latch circuit 4a includes a latch 4aa which takes in signal ERA of 6 bits in externally applied address signal ERA<10:0> of 11 bits in synchronization with the rising of test clock signal ETCLK.

Signal distributing circuit 4b includes buffers 4ba and 4bb which receive and buffer the data of 6 bits in parallel from latch 4aa. Latch circuit 4c includes a latch 4ca which latches the 6-bit signal received from buffer 4ba in response to the rising of test clock signal /ETCLK for generation of 6-bit row address signal RA, and a latch 4cb which takes in and latches the 4-bit signal received from buffer 4bb in response to the rising of test clock signal /ETCLK, and generates 6-bit column address signal CA<5:0>.

Therefore, signal distributing circuit 4b merely separates the address signal, which is applied to pad group 8e, into the row address signal and the column address signal. The row and column address signals can be produced by a simple circuit structure with a reduced number of pads.

In the structure shown in FIG. 14, row address signal ERA<10:0> is an 11-bit signal, and the column address signal is 6-bit signal CA<5:0>. Therefore, five bits still remain available in the pads receiving the address signal. Address OSEL for out data selection is of 5 bits, so that the remaining pads in the address input pads can be utilized as the input pads for output data selection address.

Figure 15:
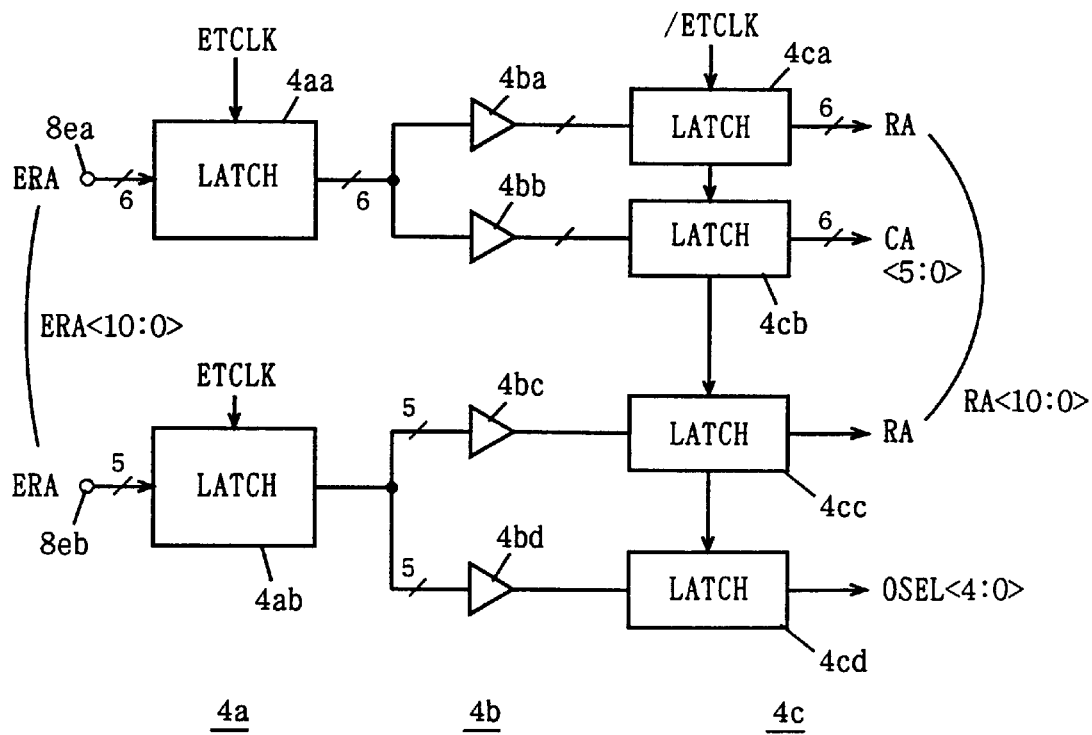
FIG. 15 schematically shows a second structure of the signal distributing circuit shown in FIG. 13.

FIG. 15 shows still another structure for address distribution. In the structure shown in FIG. 15, a latch 4ab which latches the applied address signal in synchronization with clock signal ETCLK is provided for pads 8eb of the remaining 5 bits in pad group 8e. Pads 8ea of 6 bits included in pad group 8e are coupled to latch 4aa similarly to the structure shown in FIG. 14.

Signal distributing circuit 4b includes 5-bit buffers 4bc and 4bd provided in parallel with latch 4ab.

Latch circuit 4c includes 5-bit latches 4cc and 4cd provided, corresponding to buffers 4bc and 4bd for latching the output signals of corresponding buffers 4bc and 4bd in synchronization with the rising of complementary test clock signal /ETCLK, respectively. Latch 4cc generates the row address signal bits, and latch 4cd generates address signal OSEL<4:0> for output data selection. The output signals of latches 4ca and 4cc are supplied, as row address signal RA<10:0>, to the SDRAM module through the selector.

In the structure shown in FIG. 15, all the address signal input pads can be commonly used, and the respective transmission paths of the bits of the row address signal bear the equal loads so that the signal transmission can be performed at the accurate timing. It is not necessary to provide an additional pad for input of the address signal for output data selection so that the pads can be further reduced in number.

Figure 16:
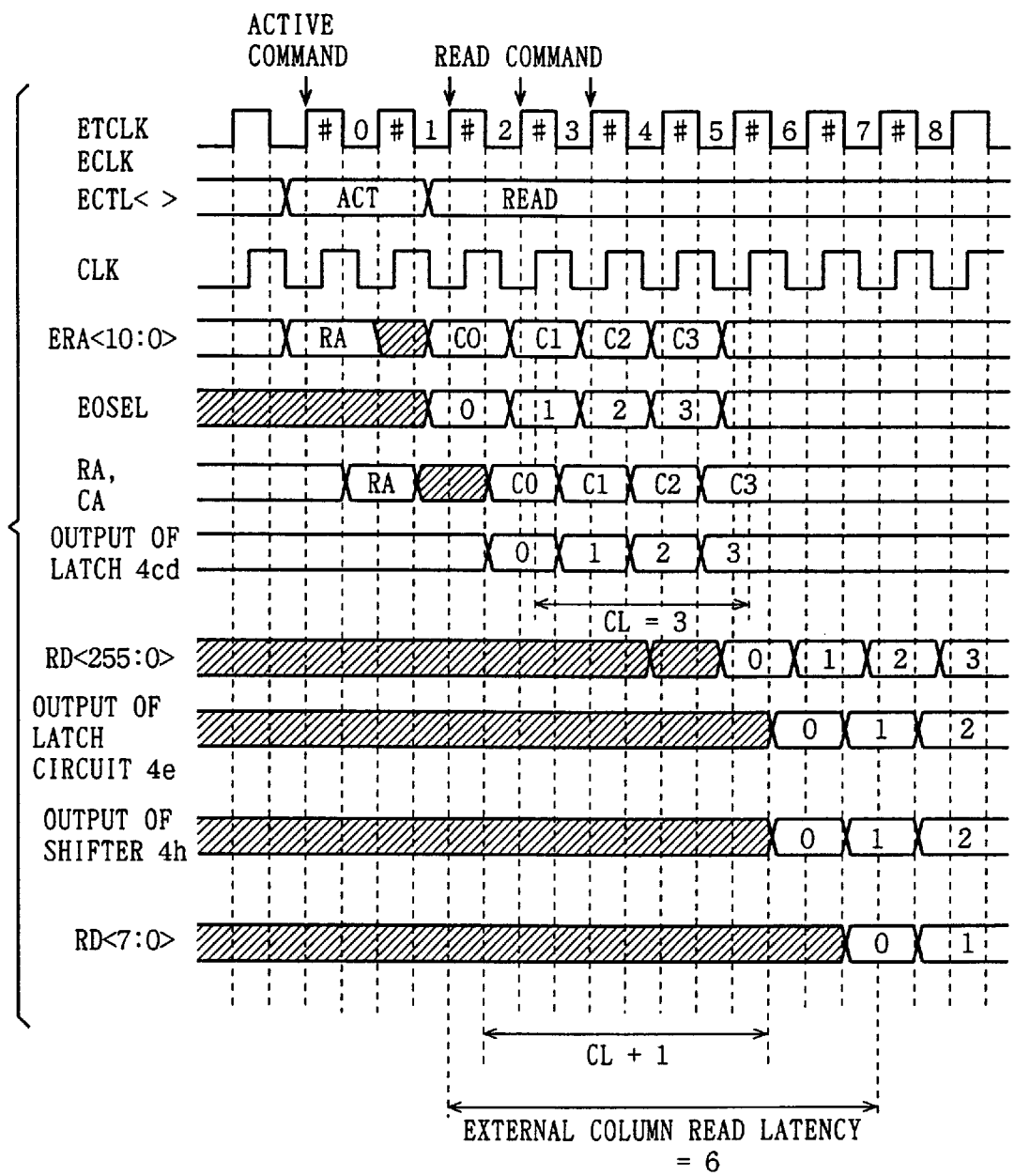
FIG. 16 is a timing chart representing an operation of the semiconductor integrated circuit device shown in FIG. 13.

FIG. 16 is a timing chart representing an operation in data reading of the semiconductor integrated circuit device of the embodiment 2 of the invention. FIG. 16 shows, by way of example, the data read operation with column read latency CL of 3.

An active command is applied in cycle #0 of external clock signal ECLK. At this time, external control signal ECTL< > is set to the state of act (ACT) representing the active command. When this active command is applied, address signal ERA<10:0> applied to the pad is a row address signal. This row address signal RA is applied from direct memory access circuit 4 to the SDRAM module in synchronization with the falling of external test clock signal ETCLK.

In clock cycle #2, a read command is applied at the rising edge of external clock signal ECLK. The column address signal is applied simultaneously with the read command. In subsequent clock cycles #3, #4 and #5, the read command is repetitively applied, and column address signals C0, C1, C2 and C3 are applied simultaneously with respective read commands. In parallel with column address signals C0–C3, address signal EOSEL for output data selection is applied. These address signal EOSEL for data selection and column address signals C(C0–C3) are applied to shifter 4h and SDRAM module 2 at the falling edge of external clock signal ECLK. In SDRAM module 2, data reading is carried out by internally performing column selection in accordance with the read command and the column address signal applied at the rising edge of clock signal CLK. Column read latency CL is 3. Therefore, when the data read operation starts in clock cycle #3 of external clock signal ECLK in this SDRAM, the read data will be made definite at the rising edge of internal clock signal CLK in clock cycle #6 of external clock signal ECLK, i.e., after elapsing of 3 clock cycles from the start of the data read operation. The data which is read from the SDRAM module is taken in and latched by latch circuit 4e in synchronization with the falling of test clock signal ETCLK.

Shifter 4h shifts the address signal received from latch 4cd by a period which is longer than column read latency by one clock cycle, and generates the same in synchronization with the falling of test clock signal ETCLK. Therefore, both the data applied from latch circuit 4e to select circuit 4f and the select address signal from shifter 4h attain the definite state at the same timing, and select circuit 4f accurately selects the read data.

The data selected by select circuit 4f is output by latch circuit 4g shown in FIG. 13 in synchronization with the falling of test clock signal ETCLK. Thus, latch circuit 4g takes in the output data of select circuit 4f in synchronization with the rising of externally applied test clock signal ETCLK, and outputs the taken data in synchronization with the falling of test clock signal ETCLK (see the structure shown in FIG. 8).

The structure shown in FIG. 16 may be modified such that read data RD<7:0> of 8 bits is output in synchronization with the rising of test clock signal ETCLK.

By using shifter 4h, it is possible to apply the address signal for output data selection simultaneously with the column address signal when the read command is applied, and it is not necessary to apply the column address signal and the address signal for data selection at different timings, respectively, which allows easy control.

[Structure of Shifter 4h]

Figure 17:
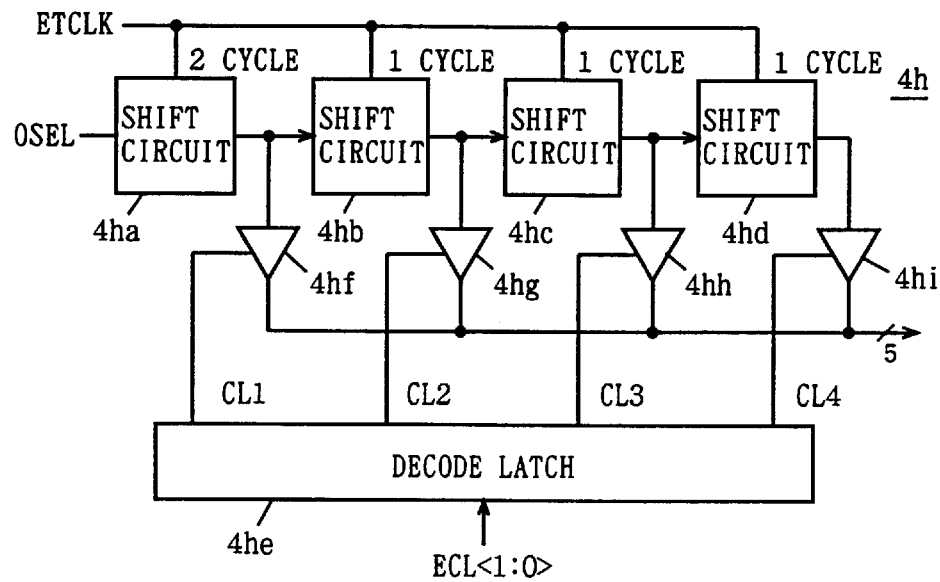
FIG. 17 schematically shows a structure of a shifter shown in FIG. 13.

FIG. 17 schematically shows a structure of shifter 4h shown in FIG. 13. In FIG. 17, shifter 4h includes shifter circuits 4ha, 4hb, 4hc and 4hd which shift the signal applied thereto in accordance with test clock signal ETCLK, a decode latch 4he which decodes externally applied data ECL<1:0> designating column read latency CL and latches the result of decoding, and tristate buffers 4hf, 4hg, 4he and 4hi which are provided at outputs of shift circuits 4aa–4hd, and are enabled in response to column read latency indicating signals CL1–CL4 from decode latch 4he, respectively. The outputs of these tristate buffers 4hf–4hi are commonly connected and coupled to select circuit 4f. The output signal of shifter 4h is applied to select circuit 4f shown in FIG. 13 as the address for output data selection.

Decode latch 4he decodes latency data ECL<1:0>, and drives one of four latency indicating signals CL1–CL4 to the active state. Tristate buffers 4hf–4hi are enabled when corresponding latency indicating signals CL1–CL4 are active, and attain the output high-impedance state when the corresponding latency indicating signals are inactive, respectively.

Shift circuit 4ha shifts the applied address signal OSEL (OSEL<4:0>) in accordance with test clock signal ETCLK for 2-cycle period. Other shift circuits 4*hb*–4*hd* shift the applied signals for a period equal to one clock cycle of test clock signal ETCLK. Shifter 4*h* performs the shift operation for a period longer than column read latency CL by one clock cycle. Therefore, only shift circuit 4*ha* at the initial stage shifts address signal OSEL applied thereto for 2-cycle period. Decode latch 4*he* decodes latency data ECL<1:0>, and drives one of latency indicating signals CL1–CL4 corresponding to the designated latency to the active state. When latency indicating signal CL1 is activated, the output signal of shift circuit 4*ha* is selected and applied to select circuit 4*f*. In this case, shift circuit 4*ha* performs the shifting of 2-cycle period, and therefore shifter 4*h* performs the shifting of a period longer than the latency by 1 clock cycle period. This is true for latency indicating signals CL2–CL4 representing the other latencies of 2, 3 and 4, respectively.

Shift circuits 4*ha*–4*hd* may be formed of the circuit shown in FIG. 8. The latch circuit shown in FIG. 8 is equivalent to the shift circuit which shifts the applied signal for a period equal to half a clock cycle. By employing two circuits each equal to that shown in FIG. 8, it is possible to achieve the shift circuit which performs the shifting of 1 clock cycle period.

The decode latch 4*he* is activated to decode column latency data ECL<1:0> and latch the result of decoding in response to activation of the column read latency setting instruction signal included in externally applied control signals.

[Structure for Eliminating Write Data Mask Bit]

Figure 18:
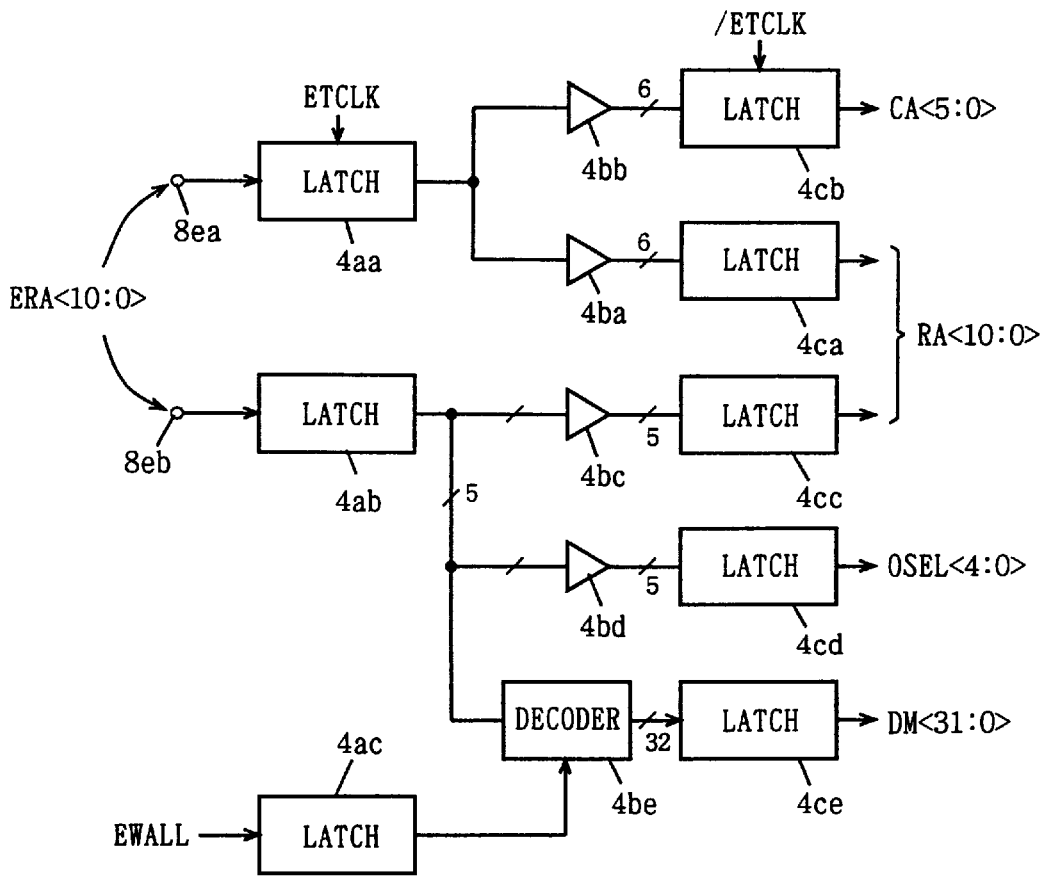
FIG. 18 schematically shows a third structure of the signal distributing circuit shown in FIG. 13.

FIG. 18 shows still another structure of direct memory access circuit 4. FIG. 18 shows only a structure of a portion related to the address signal. The structure shown in FIG. 18 includes in addition to the structure shown in FIG. 15, a decoder 4*be*, which receives the output signal of 5-bit latch 4*be*, and performs the decoding in data writing to produce 32 write data mask bits DM<31:05, a latch 4*ce* which latches the output signal of decoder 4*be* in accordance with complementary test clock signal /ETCLK, and a latch 4*he* which latches an externally applied mask release instructing signal EWALL in accordance with test clock signal ETCLK, and applies the latched signal to decoder 4*ba*. Structures other than the above are the same as those shown in FIG. 15. Corresponding portions bear the same reference numerals, and will not be described below.

In the data write operation, decoder 4*be* decodes the signal of 5 bits, and drives one of 32 outputs thereof to the selected state. In this operation, decoder 4*be* sets all the signals to the mask disabled state when signal EWALL from latch 4*ac* is in the mask release instructing state. According to the structure shown in FIG. 18, it is not necessary to provide a pad for bits EWD<31:0> masking the write data as well as the latches at the initial stage so that it is possible to reduce the number of pads (the number of output terminals of the test device) and the number of components of the direct memory access circuit. The output signal of decoder 4*be* specifies one of the 32 column blocks. The mask for all the column blocks is released by signal EWALL applied to latch 4*ac*. Thereby, the state of signal applied to pad group 8*eb* can be set to the "DON'T CARE" state in the data writing, and the test can be performed with data written into all the column blocks.

Figure 19:
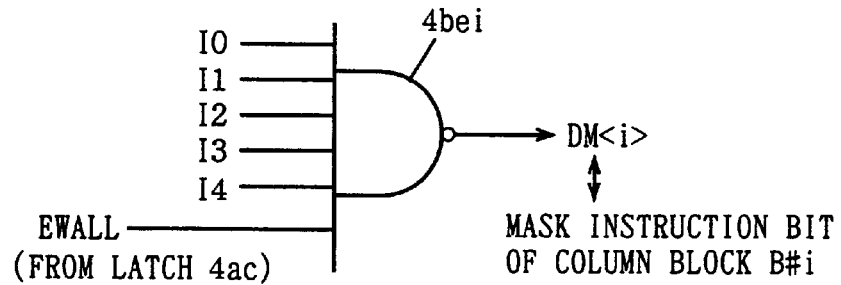
FIG. 19 schematically shows a structure of a decoder shown in FIG. 18.

FIG. 19 shows an example of a structure for write mask instruction data WD<i> of 1 bit of decoder 4*be* shown in FIG. 18. In FIG. 19, decoder 4*be* includes an NAND circuit 4*bei* receiving signals I0–I4 applied from latch 4*ab* as well as signal EWALL from latch 4*ac*. NAND circuit 4*bei* generates write data mask instruction bit DM<i>. NAND circuit 4*bei* sets write mask instruction bit WD<i> to H-level, to allow writing of data into corresponding column block B#i, when signal EWALL is at L-level. When signal EWALL is at H-level, NAND circuit 4*bei* sets the logical state of mask instruction bit DM<i> in accordance with a combination of the logical states of applied signals I0–I4. When all input signals I0–I4 are at H-level, write mask instruction bit DM<i> attains L-level, and writing of data into the corresponding column block #Bi is prohibited. In this case, input signals I0–I4 are of a predetermined combination of the signals applied from pad group 8*eb* through latch 4*ab* and the complementary signals thereof. When signal EWALL is set to L-level, write mask instruction bit WD<i> attains H-level independently of the logical state of input signals I0–I4 so that data can be reliably written into the corresponding column block.

The structure shown in FIG. 19 may be modified such that NAND circuit 4*bei* performs decoding when a signal (write command) instructing data writing is applied. This can be achieved, for example, by providing an AND circuit, which receives the output signal of NAND circuit 4*bei* and the write command, at the output stage of NAND circuit 4*bei*.

According to the third embodiment, as described above, the pad group for masking the writing and the row address signal input pad group can be commonly used so that the pads and the latch circuits in the initial stage can be reduced in number.

[Modification]

Figure 20:
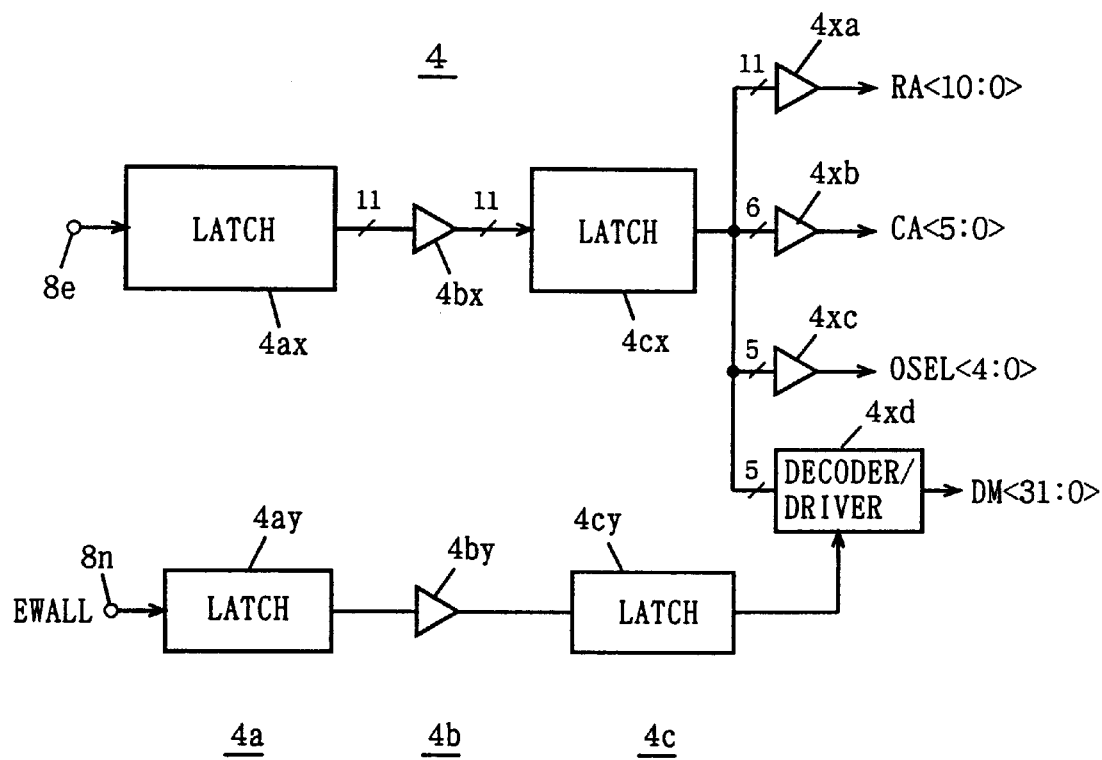
FIG. 20 schematically shows a structure of a modification of the embodiment 2 of the invention.

FIG. 20 schematically shows a structure of a modification of the direct memory access circuit according to the embodiment 2 of the invention. In FIG. 20, direct memory access circuit 4 includes a latch 4*ax* which latches a signal of 11 bits applied to pad group 8*e* in synchronization with a test clock signal (not shown), a latch 4*ay* of 1 bit which latches signal EWALL applied to pad 8*n* in synchronization with the test clock signal, a buffer circuit 4*bx* of 11 bits which buffers the output signal of latch 4*ax*, a buffer circuit 4*by* of 1 bit which buffers the output signal of latch 4*ay*, a latch 4*cx* of 1 bit which latches the output signal of 11 bits of buffer 4*bx* in synchronization with a complementary test clock, and a latch 4*cy* of 1 bit which latches the output signal of buffer circuit 4*by* in synchronization with the complementary test clock signal.

Latches 4*ax* and 4*ay* are included in latch circuit 4*a* shown in FIG. 13. Buffer circuits 4*bx* and 4*by* are included in signal distributing circuit 4*b* shown in FIG. 13. Latches 4*cx* and 4*cy* are included in latch circuit 4*c* shown in FIG. 13.

Direct memory access circuit 4 further includes a buffer circuit 4*xa* of 11 bits which buffers the 11-bit signal received from latch 4*cx*, and generates row address signal RA<10:0>, a buffer circuit 4*xb* which buffers a signal of 6 bits in the 11-bit signal received from latch 4*cx*, and generates column address signal CA<5:0>, a buffer circuit 4*xc* of 5 bits which buffers the remaining 5-bit signal, and generates address OSEL<4:0> for output data selection, and a decoder/driver 4*xd* which receives the same signal as buffer 4*xc*, and performs decoding and buffering in accordance with the output signal of latch 4*cy*. Decoder/driver 4*xd* issues write data mask instruction bit DM<31:0>.

In the structure shown in FIG. 20, signal distribution is effected on the output signal of latch 4*cx* included in latch circuit 4*c* at the output stage of the direct memory access circuit. In this structure, the number of latches included in latch circuit 4*c* at the output stage of the direction memory access circuit can be made equal to the number of pads, and the components of the direct memory access circuit can be further reduced in number. The structure of decoder/driver 4xd is the same as that shown in FIGS. 18 or 19. Accordingly, the structure shown in FIG. 20 differs from the foregoing structure merely in that the distribution for pad group 8e is effected on the output of latch circuit 4c at the output stage of the memory access circuit 4, and performs the same operation.

The form of common use of the pad groups can be appropriately selected from the foregoing forms depending on the numbers of bits and the application timings of the respective signals.

According to the embodiment 2 of the invention, as described above, the common pad group is commonly utilized for a plurality of kinds of signals so that the pads and the circuit components can be reduced in number.

[Embodiment 3]

Figure 21:
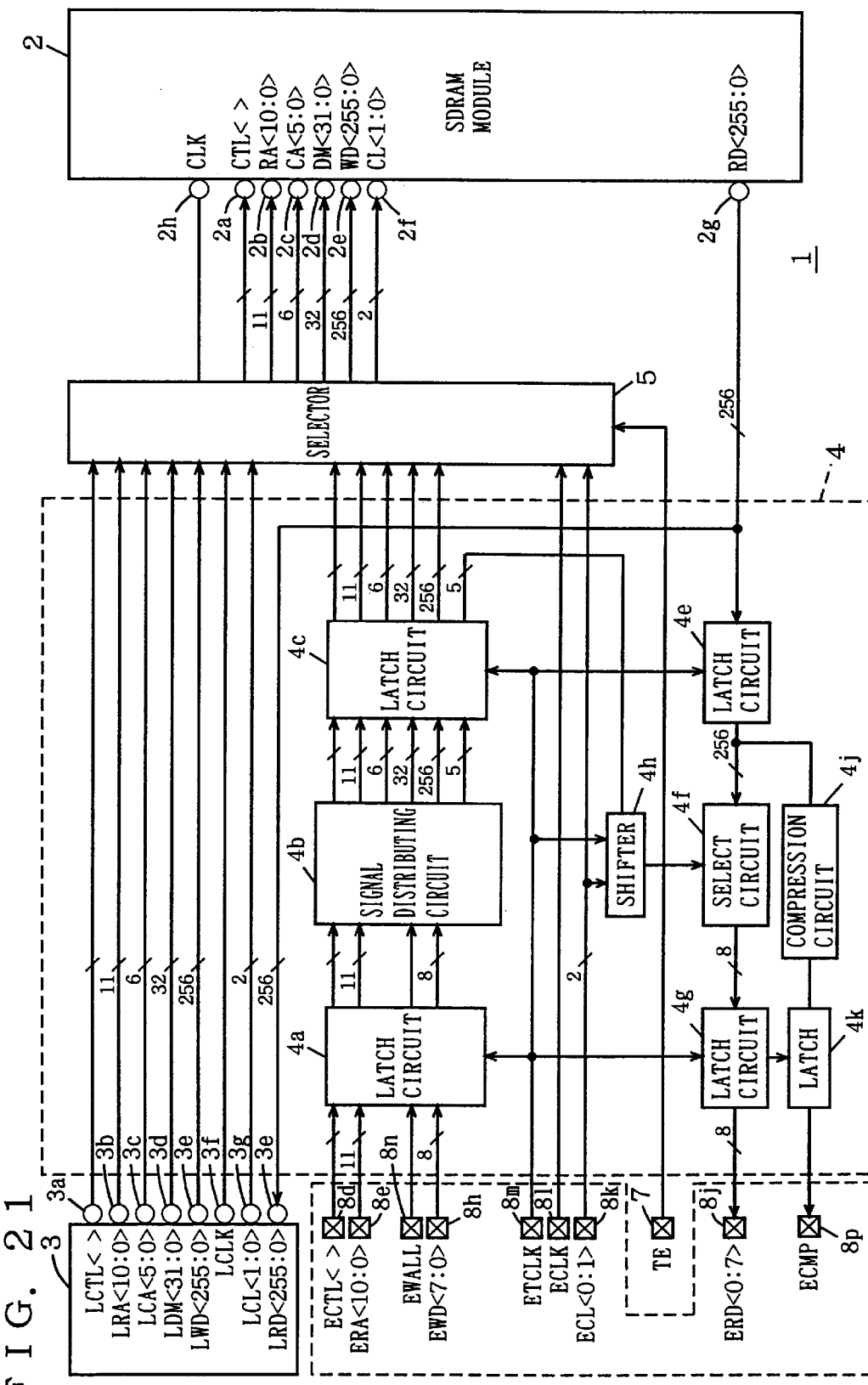
FIG. 21 schematically shows a whole structure of a semiconductor integrated circuit device according to an embodiment 3 of the invention.

FIG. 21 schematically shows a whole structure of a semiconductor integrated circuit device according to an embodiment 3 of the invention. The semiconductor integrated circuit device shown in FIG. 21 differs from the semiconductor integrated circuit device shown in FIG. 13 in the following point. The device is provided with a compression circuit 4j which compresses data of 256 bits issued from latch circuit 4e into data of 1 bits, and a latch 4k which transfers and applies a signal of 1 bit from compression circuit 4j to a pad 8p in accordance with test clock signal ETCLK. Structures other than the above are the same as those shown in FIG. 13. Corresponding portions bear the same reference numbers, and will not be described below.

By compressing the 256-bit data into the 1-bit signal with compression circuit 4j, the test time can be significantly reduced, compared with the case wherein the 256-bit data is successively selected by select circuit 4f and is output eight bits at a time.

Figure 22:
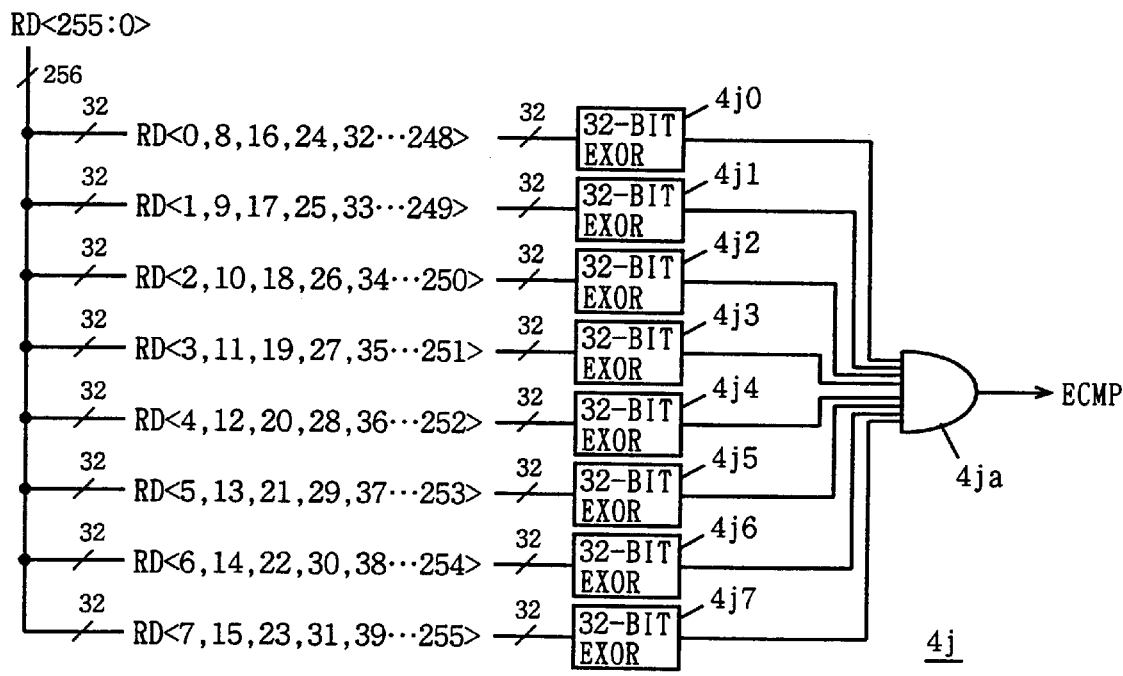
FIG. 22 schematically shows a structure of a compression circuit shown in FIG. 21.

FIG. 22 schematically shows a structure of compression circuit 4j shown in FIG. 21. In FIG. 22, compression circuit 4j includes 32-bit EXOR circuits 4j0–4j7 each receiving 32-bit data and determining matching/mismatching of logic of the received bits, and AND circuit 4ja which receives the output signals of 32-bit EXOR circuits 4j0–4j7, and produces a matching/mismatching representing signal ECMP. 32-bit EXOR circuit 4j0 receives bits of RD<8i> in read data RD<255:0>, where i is an integer in a range from 0 to 31. Therefore, 32-bit EXOR circuit 4jx receives bit RD<8i+x>, where x is an integer in a range from 0 to 7. The data bits which 32-bit EXOR circuits 4j0–4j7 receive, respectively, are data bits corresponding to the same write data bits in the 32 column blocks B#0–B#31 already described. A relationship between the write data and the read data will be described below with reference to FIG. 23.

Figure 23:
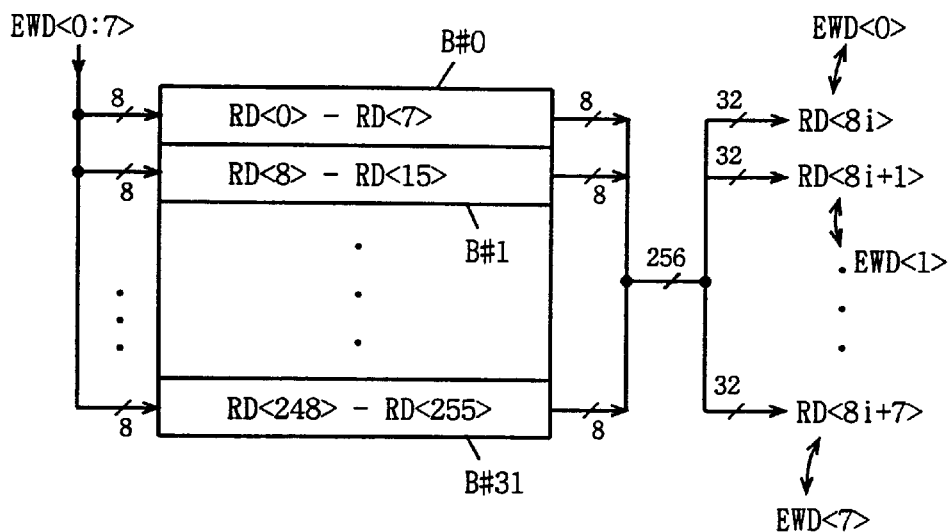
FIG. 23 schematically shows relationships between test write data, write data for a memory cell and read data for a memory cell.
Figure 24:
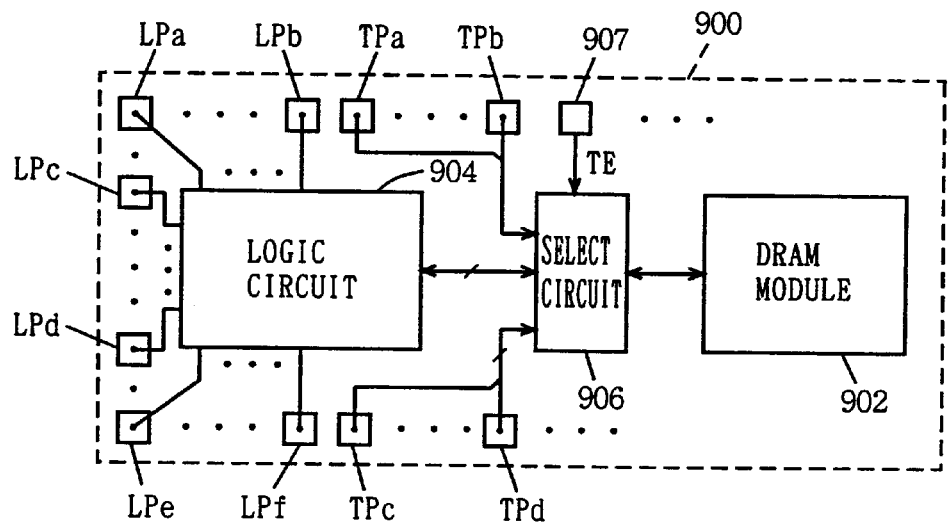
FIG. 24 schematically shows a structure of an asynchronous DRAM embedded semiconductor integrated circuit device in the prior art.
Figure 25:
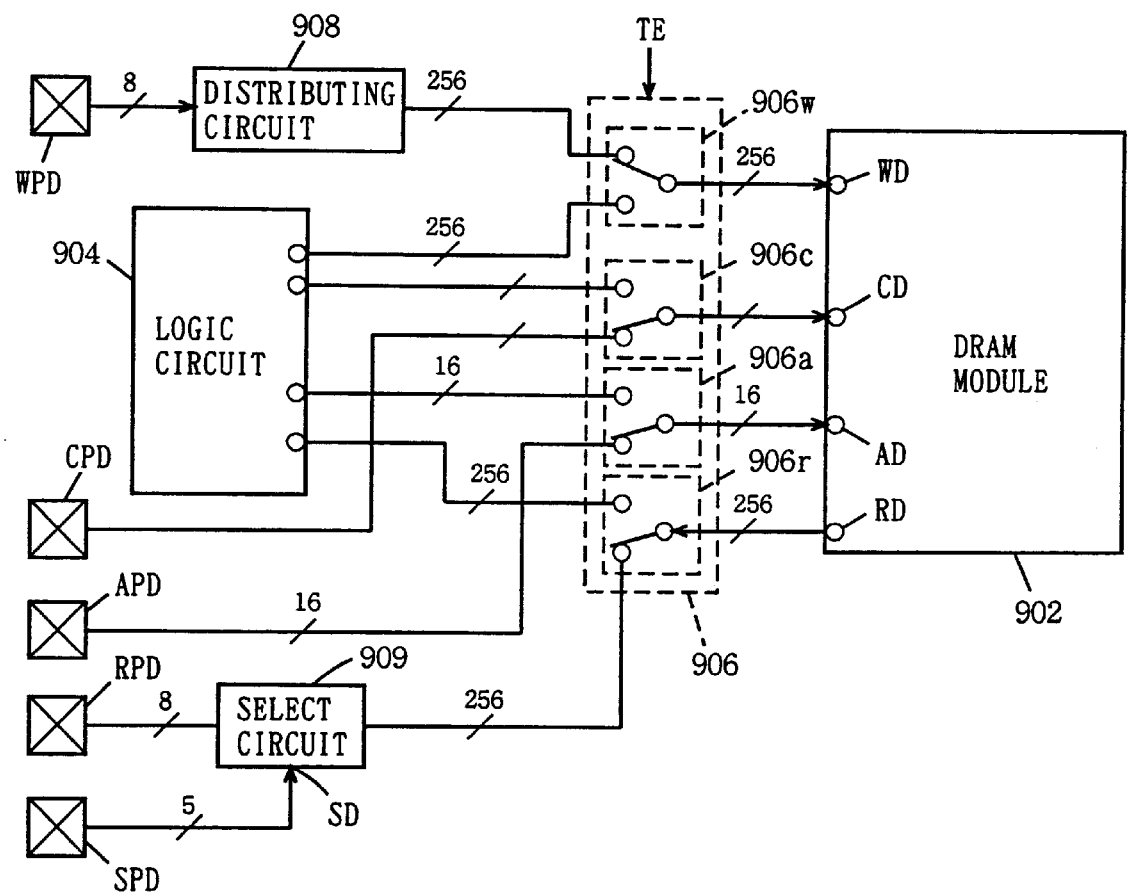
FIG. 25 shows more specifically the structure in FIG. 24.
Figure 26:
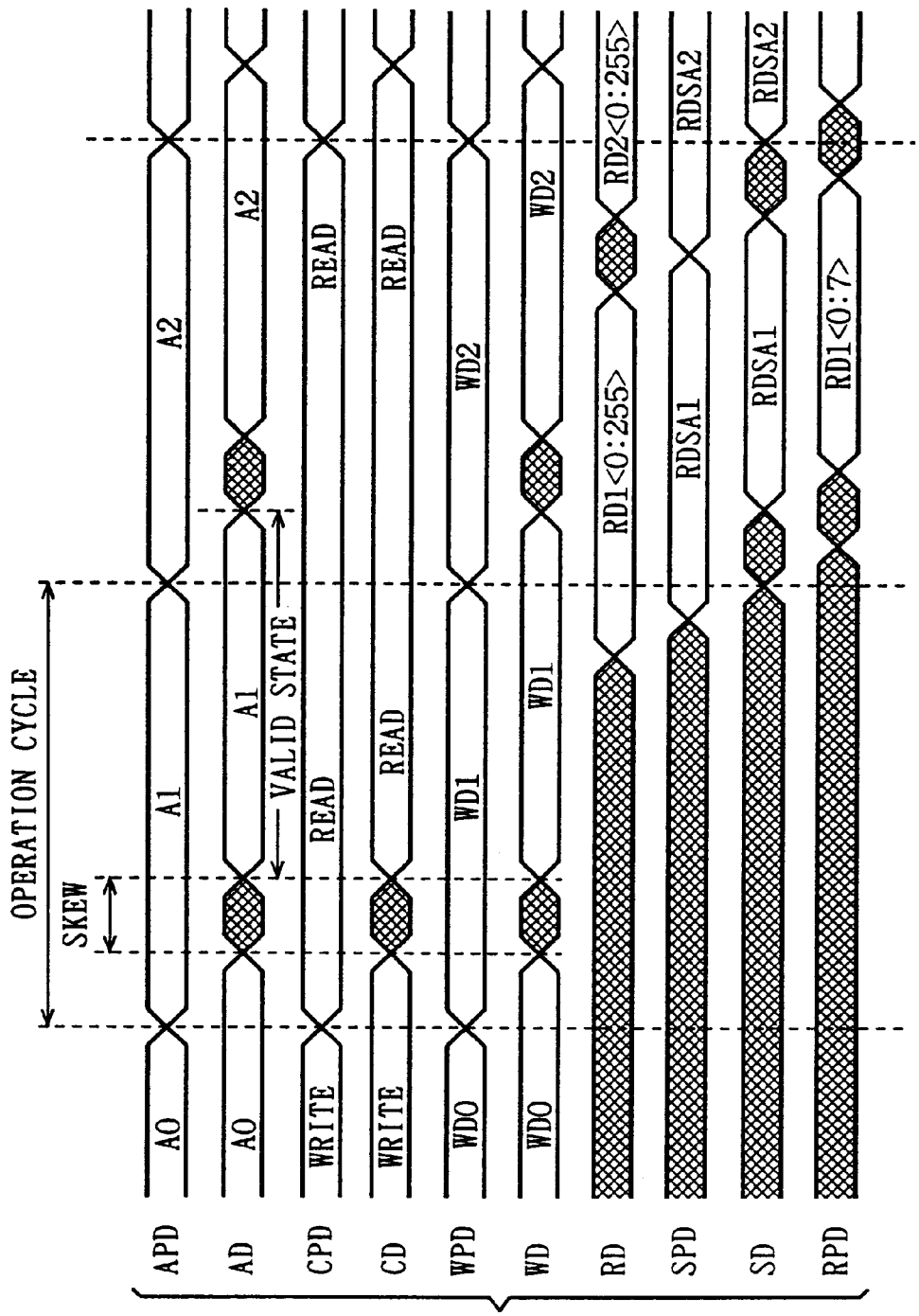
FIG. 26 is a timing chart representing an operation of the semiconductor integrated circuit device shown in FIG. 24.
Figure 27:
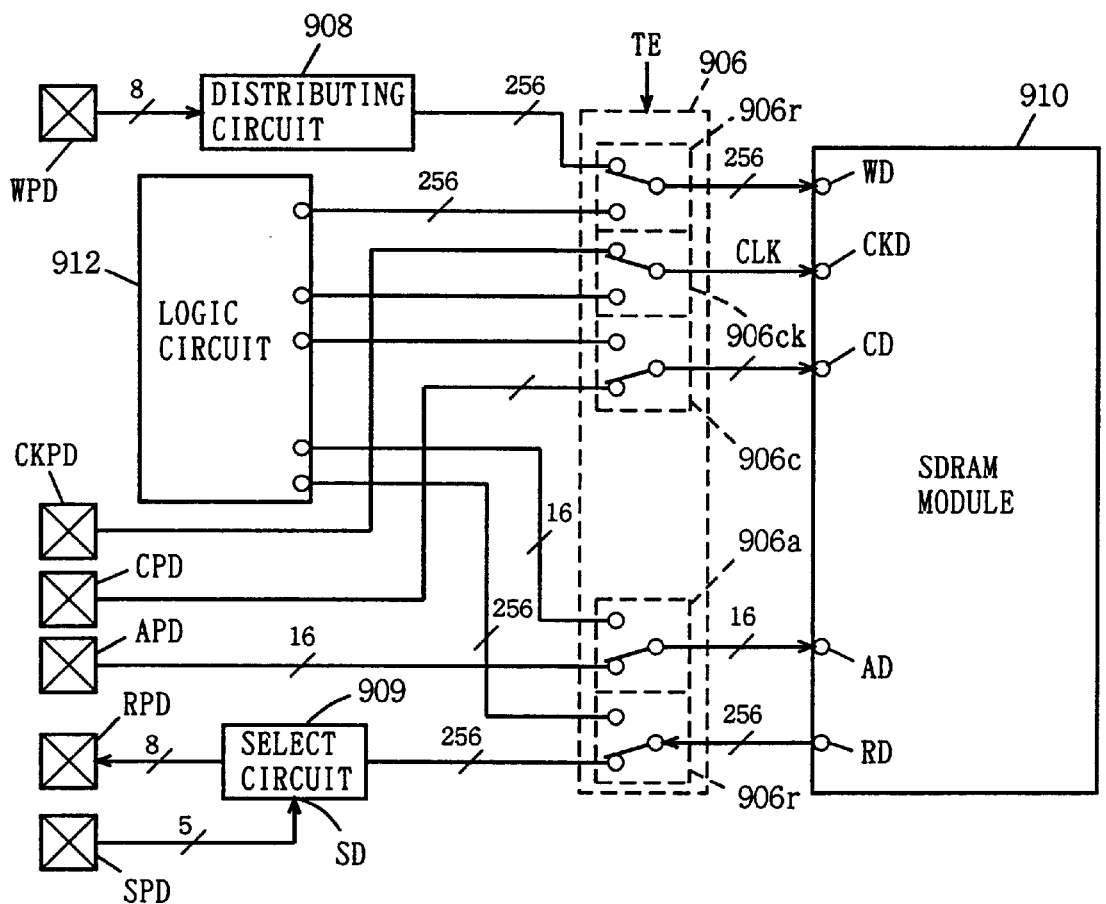
FIG. 27 schematically shows a structure including a synchronous memory employed in place of the semiconductor integrated circuit device shown in FIG. 24.
Figure 28:
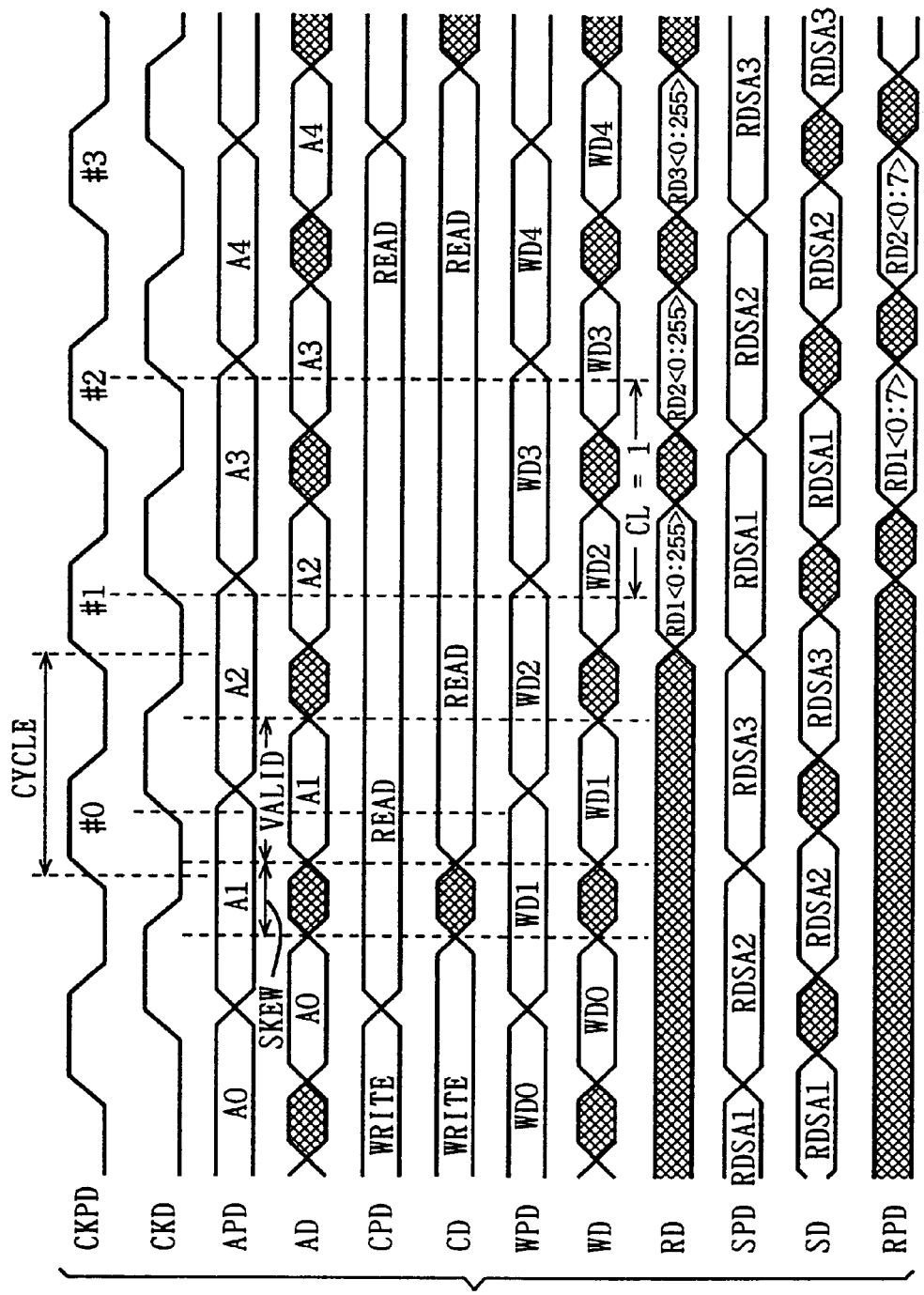
FIG. 28 is a timing chart representing an operation of the semiconductor integrated circuit device shown in FIG. 27.
Figure 29:
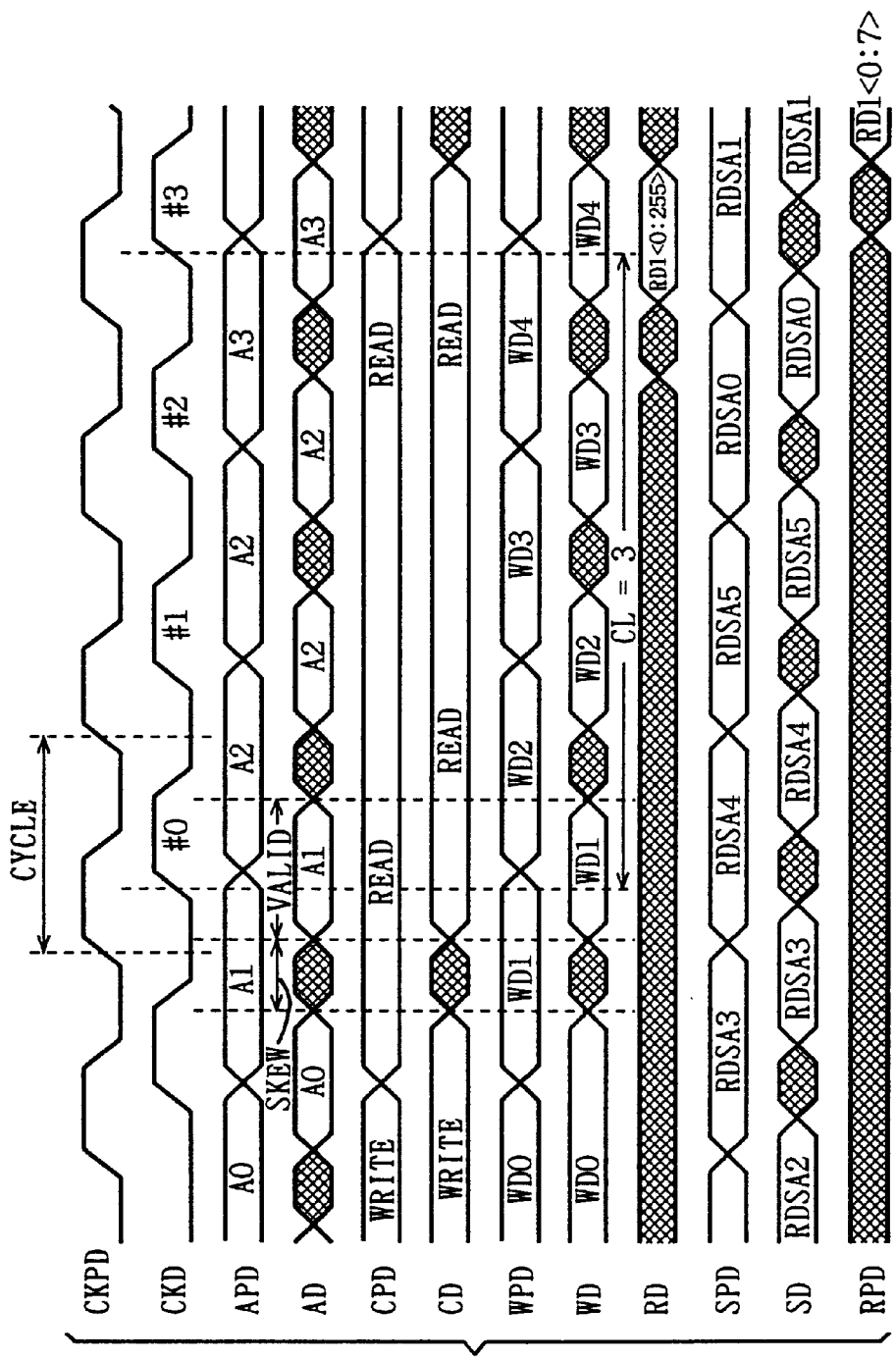
FIG. 29 is a timing chart representing the operation of the semiconductor integrated circuit device shown in FIG. 27.

As shown in FIG. 23, the memory array includes 32 column blocks B#0–B#31. Read data bits RD<0>–RD<7> are read from column block B#0. Read data bits RD<8>–RD<15> are read from column block B#1. Data of 8 bits are likewise read from each of the other column blocks. Read data bits RD<248>–RD<255> are read from column block B#31.

In the test operation, externally supplied write data EWD<0:7> of 8 bits is written into each of column blocks B#0–B#31 (see FIG. 11). In the test operation, therefore, 8-bit data corresponding to write data EWD<0:7> is read in parallel, as read data, from each of column blocks B#0–B#31. In the data of 256 bits in total which is read in parallel from column blocks B#0–B#31, the read data bits are divided into groups each corresponding to a common write data bit. Therefore, each bit in the group of read data bit RD<8i> corresponds to externally applied write data bit EWD<0>, and read data bit RD<8i+1> corresponds to externally applied write data bit EWD<1>. Likewise, read data bit RD<8i+7> corresponds to write data bit EWD<7>. This grouping can be easily achieved by determining the groups in accordance with bus lines of the 8-bit global data bus GIO provided at each column block, respectively.

Therefore, even when an inter-bit interference test is performed, using, as write data EWD<0:7>, various kinds of write data having different bit patterns, each of 32-bit EXOR circuits 4j0–4j7 shown in FIG. 22 receives the read data bits corresponding to a common write data bit so that a failure in memory cell can be accurately detected by determining matching/mismatching of the logics thereof.

Grouping of the data bits can be easily achieved by employing the following relationship between global data bus lines GIO0–GIO7 and the data. Write data bit EWD<0>–EWD<7> are determined to correspond to global I/O bus lines GIO0–GIO7, respectively. Data is read onto global I/O bus line pairs GIO0–GIO7. Global I/O bus lines pair GIO0–GIO7 are determined to correspond to read data bits RD<8i>–RD<8i+7>, respectively. In each column block, therefore, read data of 8 bits can be easily classified in accordance with the write data.

According to the embodiment 3 of the invention, as described above, the data of 256 bits which are read simultaneously is compressed into 1-bit data for output so that the test time can be significantly reduced.

[Other Examples of Application]

The semiconductor integrated circuit device described above contains the synchronous memory which takes in the data and the external signal at the rising or falling edge of the clock signal. However, the invention can be applied to a synchronous memory called a DDRSDRAM, which performs input and output of data in synchronization with the rising and falling edges of the clock signal, and takes in external signals (control signal and address signal) at one of the edges of clock signal. By providing two latch circuits at the write data transmission path and the read data transmission path such that these latch circuits on the two paths are selected in synchronization with the rising and falling of the clock signal, data transfer can be performed in synchronization with the rising and falling of the clock signal, and writing/reading of the data at DDR (double data rate) can be performed. Since the control signal and address signal are merely transferred in synchronization with one of the edges of clock signal, the same structure as those in the foregoing embodiments 1 to 3 can be used.

The synchronous memory is required merely to operate in synchronization with the clock signal and therefore may be an SSRAM (synchronous SRAM). Further, the synchronous memory may be a so-called flash memory, i.e., a collectively erasable EEPROM (electrically erasable and programmable read only memory) provided that it takes in an external signal and outputs data in synchronization with a clock.

Logic circuit 3 may include a command decoder which decodes a command designating an operation mode, and produces an operation mode instructing signal, and the SDRAM module may be supplied with the operation mode instructing signal. In this structure, the command decoder may be arranged in the direct memory access circuit 4. In this case, the external test device can use a conventional test program for an SDRAM, and can performs the test by externally and directly accessing the SDRAM module without changing the sequence of generating control signals. Further, such a structure may be employed that the test device produces and generates the operation mode instructing signal to direct memory access circuit 4.

According to the invention, as described above, the direct memory access circuit which operates in synchronization with a clock signal corresponding to an operation clock of the synchronous memory is provided in an on-chip form, and one of the logic circuit and the direct memory access circuit is selected and is connected to the synchronous memory by the selector in accordance with the test mode instructing signal. Therefore, a skew in the signal can be suppressed, and a fast and accurate test can be externally performed on a synchronous memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device comprising:

a synchronous memory performing input and output of data and taking in an applied signal in synchronization with a clock signal;

a logic circuit formed on a common semiconductor substrate with said synchronous memory for performing transmission of data to and from said synchronous memory;

a synchronous direct memory access circuit for taking in a signal including data and applied externally to said semiconductor substrate in synchronization with a test clock signal corresponding to said clock signal; and a select circuit for selecting one of an output signal of said logic circuit and an output signal of said synchronous direct memory access circuit in response to a test mode instructing signal for application to said synchronous memory.

2. The semiconductor integrated circuit device according to claim 1, wherein said synchronous direct memory access circuit includes means for transferring the taken signal to said select circuit in synchronization with said test clock signal at a timing different from a timing of taking in the externally applied signal in synchronization with said test clock signal.

3. The semiconductor integrated circuit device according to claim 1, wherein said synchronous memory includes means for outputting data of multiple bits in synchronization with said clock signal, and said synchronous direct memory access circuit further includes data taking means for receiving the data of multiple bits read from said synchronous memory and taking in the received data in synchronization with said test clock signal.

4. The semiconductor integrated circuit device according to claim 3, wherein said synchronous direct memory access circuit includes:

address transferring means for transferring an externally applied address signal in synchronization with said test clock signal, and data select means for selecting data of a predetermined number of bit(s) from the data of the multiple bits taken into said data taking means in accordance with an address transferred from said address transferring means.

5. The semiconductor integrated circuit device according to claim 4, wherein said address transferring means includes a shift circuit performing a transferring operation in synchronization with said test clock signal to delay the address signal applied at a time of application of a data read instruction by a period corresponding to a clock cycle(s) required from reception of said data read instruction to output of valid data by said synchronous memory, and applying the delayed signal to said data select means.

6. The semiconductor integrated circuit device according to claim 1, wherein said synchronous memory includes means for outputting data of multiple bits in data reading; and said synchronous direct memory access circuit further includes:

data latch means for latching the data of the multiple bits read from said synchronous memory in synchronization with said test clock signal, an address latch for latching an applied address signal at a same timing as data latching by said data latching means, and data select means for selecting data of a predetermined number of bit(s) from the data latched by said data latch means in accordance with the address signal latched by said address latch.

7. The semiconductor integrated circuit device according to claim 4, wherein said synchronous direct memory access circuit further includes output transfer means for externally outputting the data selected by said data select means in synchronization with said test clock signal.

8. The semiconductor integrated circuit device according to claim 1, wherein said synchronous direct memory access circuit further includes means for dividing an address signal applied through a predetermined pad in a time-division multiplexing manner into a row address signal and a column address signal, and said synchronous memory has a row address input node and a column address input node provided independently of each other for receiving the divided row and column address signals through said select circuit, respectively.

9. The semiconductor integrated circuit device according to claim 8, wherein said row address signal is larger in bit number than said column address signal, and said synchronous memory outputs data of multiple bits in data reading; and said predetermined pad includes a first pad for receiving said column address signal, and a second pad for receiving a data address signal for selecting data of a predetermined number of bit(s) from a data of the multiple bits read from said synchronous memory, said first and second pads receiving in parallel different bits of said row address signal, respectively.

10. The semiconductor integrated circuit device according to claim 9, wherein said predetermined pad includes a pad receiving a mask instruction signal instructing a masking on a write data in data writing to said synchronous memory, and said synchronous direct memory access circuit further includes means for separating said mask instruction signal from a signal applied to said predetermined pad.

11. The semiconductor integrated circuit device according to claim 10, wherein the pad receiving the mask instruction bit is said second pad.

12. The semiconductor integrated circuit device according to claim 1, wherein said clock signal and said test clock signal have a common frequency.

13. The semiconductor integrated circuit device according to claim 1, wherein
said clock signal and said test clock signal are applied to said synchronous direct memory access circuit through different pads, respectively.

14. The semiconductor integrated circuit device according to claim 3, wherein
said synchronous direct memory access circuit further includes means for compressing the data of multiple bits received from said data taking means into data of one bit for outputting in synchronization with said test clock signal.

15. The semiconductor integrated circuit device according to claim 1, wherein
said synchronous direct memory access circuit includes means for receiving externally applied write data of multiple bits, producing test write data of bits larger in number than the bits of the received write data, and transferring said test write data in synchronization with said test clock signal; and said synchronous memory has a write data input node receiving bits of said test write data in parallel.

16. The semiconductor integrated circuit device according to claim 10, wherein
said synchronous direct memory access circuit further includes means for setting all the data bits of the write data to a write enable state regardless of a state of said mask instruction bit in accordance with an externally applied control signal.

17. The semiconductor integrated circuit device according to claim 6, wherein
said synchronous direct memory access circuit further includes output transfer means for externally outputting data selected by said data select means in synchronization with said test clock signal.

18. The semicondcutor integrated circuit device according to claim 10, wherein said synchronous direct memory access circuit further includes means for decoding the mask instruction signal to produce a multi-bit write mask instruction instructing a masking of data writing for a multi-bit write data on a bit-by-bit basis.

* * * * *

UNITED STATES PATENT AND TRADEMARK OFFICE
CERTIFICATE OF CORRECTION

PATENT NO. : 5,991,232
DATED : November 23, 1999
INVENTOR(S) : Masashi MATSUMURA, et al.

It is certified that error appears in the above-identified patent and that said Letter Patent is hereby corrected as shown below:

In the Claims

Column 23, Claim 1, Line 26, before "semiconductor" insert --common--.

Signed and Sealed this

Seventeenth Day of April, 2001

Attest:

NICHOLAS P. GODICI

*Attesting Officer*  *Acting Director of the United States Patent and Trademark Office*